United States Patent
Dokan et al.

(10) Patent No.: US 11,871,503 B2
(45) Date of Patent: *Jan. 9, 2024

(54) PLASMA PROCESSING METHOD AND PLASMA PROCESSING APPARATUS

(71) Applicant: Tokyo Electron Limited, Tokyo (JP)

(72) Inventors: Takashi Dokan, Miyagi (JP); Shinji Kubota, Miyagi (JP); Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 17/592,509

(22) Filed: Feb. 4, 2022

(65) Prior Publication Data

US 2022/0159820 A1 May 19, 2022

Related U.S. Application Data

(63) Continuation of application No. 16/979,655, filed as application No. PCT/JP2019/022952 on Jun. 10, 2019, now Pat. No. 11,337,297.

(30) Foreign Application Priority Data

Jun. 22, 2018 (JP) .................................. 2018-119087

(51) Int. Cl.
*H05H 1/46* (2006.01)
*H01J 37/32* (2006.01)
(Continued)

(52) U.S. Cl.
CPC ......... *H05H 1/46* (2013.01); *H01J 37/32183* (2013.01); *H01L 21/3065* (2013.01); *H01L 21/31116* (2013.01); *H01J 2237/334* (2013.01)

(58) Field of Classification Search
None
See application file for complete search history.

(56) References Cited

U.S. PATENT DOCUMENTS 5,352,324 A 10/1994 Gotoh et al.
5,614,060 A 3/1997 Hanawa
(Continued)

FOREIGN PATENT DOCUMENTS

JP 06-267895 A 9/1994

OTHER PUBLICATIONS

International Search Report and Written Opinion dated Jul. 23, 2019 for PCT/JP2019/022952 filed on Jun. 10, 2019, 7 pages including English Translation of the International Search Report.

*Primary Examiner* — Srinivas Sathiraju
(74) *Attorney, Agent, or Firm* — XSENSUS LLP

(57) ABSTRACT

A plasma processing method includes performing a first plasma processing in a processing chamber in a first period, and performing a second plasma processing in the processing chamber during a second period continuously after the first period. In the first period and the second period, a first radio-frequency power for bias is continuously supplied to a lower electrode. A second radio-frequency power for plasma generation may be supplied as a pulsed radio-frequency power in a first partial period in each cycle of the first radio-frequency power in the first period. The second radio-frequency power may be supplied as a pulsed radio-frequency power in a second partial period in each cycle of the first radio-frequency power in the second period.

9 Claims, 22 Drawing Sheets

(51) Int. Cl.
*H01L 21/3065* (2006.01)
*H01L 21/311* (2006.01)

(56) References Cited

U.S. PATENT DOCUMENTS

| | | | |
|---|---|---|---|
| 5,980,769 A | 11/1999 | Yanagisawa et al. | |
| 6,660,647 B1 | 12/2003 | Ono et al. | |
| 6,767,838 B1 | 7/2004 | Ono et al. | |
| 6,849,191 B2 | 2/2005 | Ono et al. | |
| 7,259,104 B2 | 8/2007 | Ono et al. | |
| 7,943,017 B2 | 5/2011 | Ramm et al. | |
| 8,545,670 B2 | 10/2013 | Kojima et al. | |
| 8,852,385 B2 | 10/2014 | Koshiishi et al. | |
| 9,043,525 B2* | 5/2015 | Valcore, Jr. | H01J 37/32935 710/305 |
| 9,295,148 B2* | 3/2016 | Fong | H01J 37/32091 |
| 9,318,304 B2 | 4/2016 | Leray et al. | |
| 9,577,516 B1 | 2/2017 | Van Zyl | |
| 9,595,423 B2 | 3/2017 | Leray et al. | |
| 9,761,419 B2 | 9/2017 | Nagami | |
| 9,831,065 B2* | 11/2017 | Fong | H01J 37/32183 |
| 9,845,527 B2 | 12/2017 | Rudigier et al. | |
| 9,966,274 B2 | 5/2018 | Kim et al. | |
| 10,157,729 B2 | 12/2018 | Valcore, Jr. | |
| 10,192,721 B2 | 1/2019 | Kasai | |
| 10,332,906 B2 | 6/2019 | Narumiya et al. | |
| 10,410,874 B2 | 9/2019 | Yoo et al. | |
| 10,448,495 B1 | 10/2019 | Dorf et al. | |
| 10,553,407 B2* | 2/2020 | Nagami | H01J 37/32697 |
| 10,555,412 B2 | 2/2020 | Dorf et al. | |
| 10,607,813 B2 | 3/2020 | Fairbairn et al. | |
| 10,665,516 B2 | 5/2020 | Matsui et al. | |
| 10,707,054 B1 | 7/2020 | Kubota | |
| 10,791,617 B2 | 9/2020 | Dorf et al. | |
| 10,811,229 B2 | 10/2020 | Van Zyl et al. | |
| 10,964,511 B2 | 3/2021 | Shim et al. | |
| 11,170,979 B2* | 11/2021 | Nagami | H01J 37/32128 |
| 11,177,115 B2* | 11/2021 | Leray | H01L 21/67069 |
| 2004/0163594 A1* | 8/2004 | Windhorn | H01J 37/32082 118/723 E |
| 2011/0278157 A1 | 11/2011 | Rudigier et al. | |
| 2014/0167613 A1* | 6/2014 | Fong | H05H 1/46 315/111.21 |
| 2016/0172162 A1* | 6/2016 | Fong | H05H 1/46 315/111.21 |
| 2016/0203958 A1 | 7/2016 | Arase et al. | |
| 2016/0329194 A1* | 11/2016 | Dokan | H01J 37/32926 |
| 2017/0062187 A1* | 3/2017 | Radomski | H01J 37/321 |
| 2017/0345620 A1* | 11/2017 | Coumou | H03J 7/08 |
| 2018/0053632 A1* | 2/2018 | Fong | H01J 37/3299 |
| 2018/0211818 A1* | 7/2018 | Kubota | H01J 37/32311 |
| 2019/0057845 A1* | 2/2019 | Nagami | H01J 37/32 |
| 2019/0318912 A1 | 10/2019 | Umehara et al. | |
| 2020/0118814 A1 | 4/2020 | Dokan et al. | |
| 2020/0126759 A1* | 4/2020 | Yokota | H01L 21/02164 |
| 2020/0126770 A1* | 4/2020 | Nagami | H01J 37/32697 |
| 2020/0203129 A1 | 6/2020 | Koshimizu | H01J 37/32183 |
| 2020/0251308 A1* | 8/2020 | Kubota | H01J 37/32183 |
| 2020/0411286 A1* | 12/2020 | Koshimizu | H01J 37/32532 |
| 2021/0051792 A1 | 2/2021 | Dokan et al. | |
| 2021/0118649 A1* | 4/2021 | Huh | H01J 37/32183 |
| 2022/0028665 A1* | 1/2022 | Nagami | H01J 37/32715 |

\* cited by examiner

FIG.20A FIG.20B FIG.20C
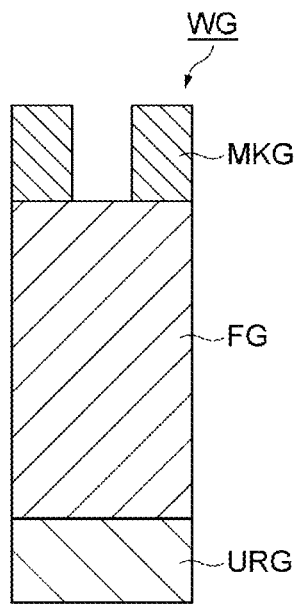 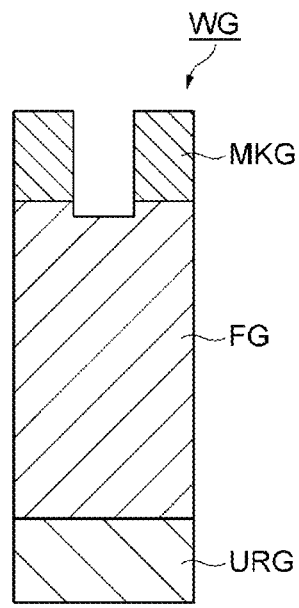 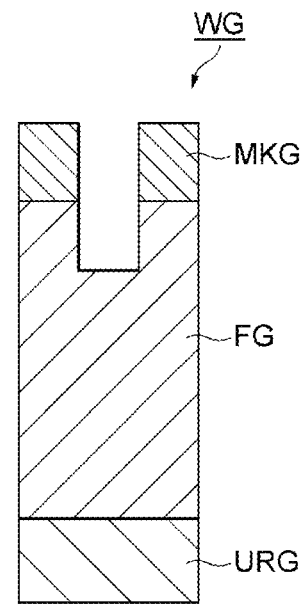
FIG.20D FIG.20E
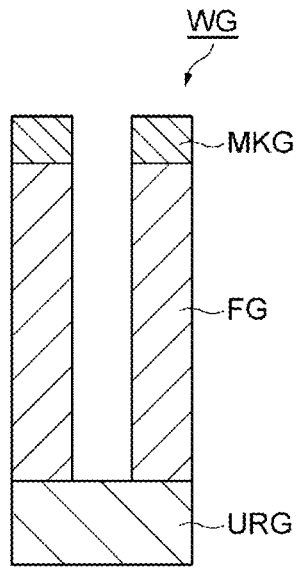 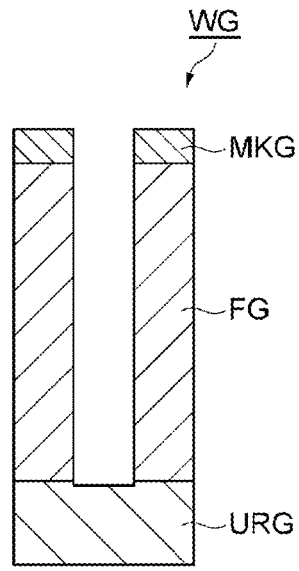

PLASMA PROCESSING METHOD AND PLASMA PROCESSING APPARATUS

CROSS REFERENCE TO RELATED APPLICATIONS

This application is a continuation application of U.S. application Ser. No. 16/979,655, filed on Sep. 10, 2020, which is a national phase of PCT application No. PCT/JP2019/022952, filed on Jun. 10, 2019, which claims priority from Japanese Patent Application No. 2018-119087, filed on Jun. 22, 2018, all of which are incorporated herein in their entireties by reference.

TECHNICAL FIELD

The present disclosure relates to a plasma processing method and a plasma processing apparatus.

BACKGROUND

In manufacturing electronic devices, a plasma processing is performed using a plasma processing apparatus including a chamber and a substrate support. The substrate support includes a lower electrode and is provided in the chamber. In the plasma processing, a radio-frequency power is supplied to excite the gas in the chamber, and plasma is generated from the gas.

An additional radio-frequency power may be supplied to the lower electrode during the plasma processing. Additional radio-frequency power has a frequency lower than that of the main radio-frequency power for plasma generation. That is, additional radio-frequency power is a bias radio-frequency power. Generally, the bias radio-frequency power is used to adjust the energy of the ions that collide with a substrate provided on a substrate support. The energy of the ions that collide with the substrate becomes higher when the bias radio-frequency power having a relatively high power level is applied to the lower electrode. Meanwhile, the energy of the ions that collide with the substrate becomes lower when the bias radio-frequency power having a low power level is applied to the lower electrode.

Patent Document 1 describes a plasma processing for etching a silicon nitride film. In the technique described in Patent Document 1, the power level of the bias radio-frequency power is set to a high level during the etching of the silicon nitride film. Further, in the technique described in Patent Document 1, when a state where both the silicon nitride film and the silicon oxide film are exposed is formed by etching the silicon nitride film, the power level of the bias radio-frequency power is alternately switched between the high level and the low level.

PRIOR ART DOCUMENT

Patent Document

Patent Document 1: Japanese Patent Laid-Open Publication No. 06-267895

SUMMARY OF THE INVENTION

Problems to be Solved

In the technical field related to a substrate plasma processing, it is required to change the energy of ions toward the substrate support at high speed.

Means to Solve the Problems

According to an embodiment, a plasma processing method is provided. The plasma processing method includes performing a first plasma processing in a chamber during a first period, and performing a second plasma processing in the chamber during a second period after the first period or subsequent to the first period. The first radio-frequency power is continuously supplied to the lower electrode of the substrate support in the step of performing the first plasma processing and the step of performing the second plasma processing. The first radio-frequency power has a first frequency. The substrate support is provided in the chamber. The second radio-frequency power is supplied as a pulsed radio-frequency power in a first partial period of the first period and a second partial period of the second period. The second radio-frequency power is a radio-frequency power for plasma generation having a second frequency higher than the first frequency. The first partial period is a part of each period of the first radio-frequency power. The second partial period is a part of each period of the first radio-frequency power and is different from the first partial period. Alternatively, the second radio-frequency power is supplied as one of a pulsed radio-frequency power and a continuous radio-frequency power in each cycle of the first radio-frequency power in the first period, and is supplied as the other radio-frequency power in each cycle of the first radio-frequency power in the second period. Alternatively, the second radio-frequency power is supplied as a pulsed radio-frequency power in each cycle of the first radio-frequency power in the first period, and is not supplied in the second period.

Effect of the Invention

According to the plasma processing method of an embodiment, it is possible to change the energy of ions toward the substrate support at high speed.

BRIEF DESCRIPTION OF THE DRAWINGS

FIG. 20A is a partially enlarged cross-sectional view of an example substrate, and FIGS. 20B to 20E are partially enlarged cross-sectional views of the example substrate in a state after performing each of a plurality of steps of the method MT7.

DETAILED DESCRIPTION TO EXECUTE THE INVENTION

Figure 1:
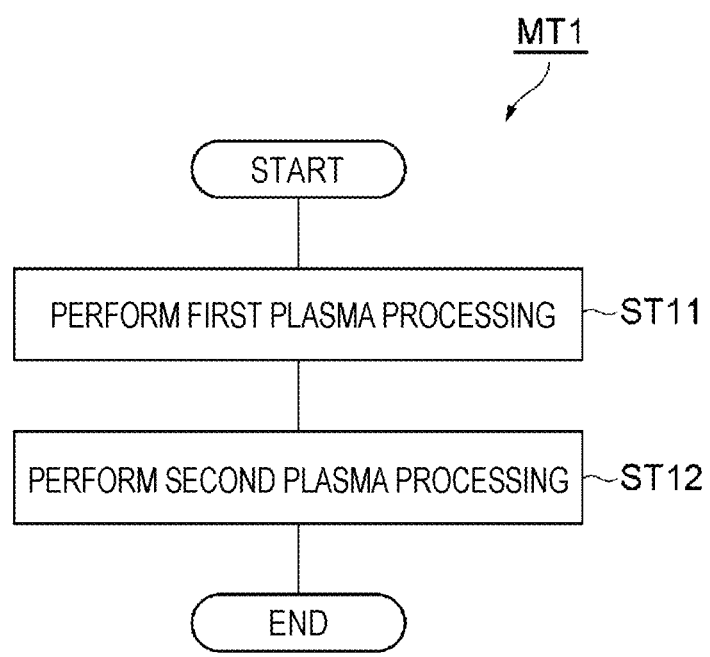
FIG. 1 is a flowchart of a plasma processing method according to an embodiment.

Various embodiments will be described below.

According to an embodiment, a plasma processing method is provided. The plasma processing method includes performing a first plasma processing in a chamber during a first period, and performing a second plasma processing in the chamber during a second period after the first period or subsequent to the first period. The first radio-frequency power is continuously supplied to the lower electrode of the substrate support in the step of performing the first plasma processing and the step of performing the second plasma processing. The first radio-frequency power has a first frequency. The substrate support is provided in the chamber. The second radio-frequency power is supplied as a pulsed radio-frequency power in a first partial period of the first period and a second partial period of the second period. The second radio-frequency power is a radio-frequency power for plasma generation having a second frequency higher than the first frequency. The first partial period is a part of each period of the first radio-frequency power. The second partial period is a part of each period of the first radio-frequency power and is different from the first partial period. Alternatively, the second radio-frequency power is supplied as one of a pulsed radio-frequency power and a continuous radio-frequency power in each cycle of the first radio-frequency power in the first period, and is supplied as the other radio-frequency power in each cycle of the first radio-frequency power in the second period. Alternatively, the second radio-frequency power is supplied as a pulsed radio-frequency power in each cycle of the first radio-frequency power in the first period, and is not supplied in the second period.

The energy of ions toward the substrate support differs depending on the mode of the second radio-frequency power. Specifically, the energy of ions toward the substrate support varies depending on whether the second radio-frequency power is supplied. The energy of ions toward the substrate support differs depending on whether the second radio-frequency power is supplied as a pulsed radio-frequency power or continuous radio-frequency power. The energy of ions toward the substrate support changes according to the period during which the second radio-frequency power is supplied with the pulsed radio-frequency power in each cycle of the first radio-frequency power. For example, when the second radio-frequency power is supplied as a pulsed radio-frequency power within a period in which the first radio-frequency power output from the first radio-frequency power supply has a positive potential, the energy of ions toward the substrate support is low. Further, when the second radio-frequency power is supplied as a pulsed radio-frequency power within a period in which the first radio-frequency power output from the first radio-frequency power supply has a negative potential, the energy of ions toward the substrate support is high. In the plasma processing method according to a first embodiment, the minimum time length during which the above mode is maintained may be set to the time length of one cycle of the first radio-frequency power. Therefore, it is possible to change the energy of the ions toward the substrate support at high speed.

In a second embodiment based on the first embodiment, the second radio-frequency power is supplied as a pulsed radio-frequency power in a first partial period of the first period and in a second partial period of the second period. The first partial period is included in a period in which the first radio-frequency power output from the first radio-frequency power supply has a negative potential in each cycle of the first radio-frequency power. The second partial period is included in a period in which the first radio-frequency power output from the first radio-frequency power supply has a positive voltage in each cycle of the first radio-frequency power. In the second embodiment, the energy of the ions towards the substrate support becomes higher during the first period and becomes lower during the second period.

In a third embodiment based on the first embodiment, the second radio-frequency power is supplied as a pulsed radio-frequency power in a period in which the first radio-frequency power output from the first radio-frequency power supply has a negative potential in each cycle of the first radio-frequency power in the first period. The second radio-frequency power is supplied as a continuous radio-frequency power in each cycle of the first radio-frequency power in the second period. In the third embodiment, the energy of the ions towards the substrate support becomes higher during the first period and becomes lower during the second period.

In a fourth embodiment based on the first embodiment, the second radio-frequency power is supplied as a continuous radio-frequency power in each cycle of the first radio-frequency power in the first period. The second radio-frequency power is supplied as a pulsed radio-frequency power in a period in which the first radio-frequency power output from the first radio-frequency power supply has a positive voltage in each cycle of the first radio-frequency power in the second period. In the fourth embodiment, the energy of the ions towards the substrate support becomes higher during the first period and becomes lower during the second period.

In a fifth embodiment based on any of the second to fourth embodiments, a substrate is disposed in the chamber during the first period and the second period. The substrate has a base region and a film provided on the base region. In the step of performing the first plasma processing, the film is etched using the plasma of the processing gas to expose the base region. In the step of performing the second plasma processing, the film is further etched using the plasma of the processing gas. According to a fifth embodiment, the energy of the ions is reduced during over-etching of the film. Therefore, damage to the base region is suppressed.

In a sixth embodiment based on any of the second to fourth embodiments, a substrate is disposed in the chamber during the first period and the second period. The substrate has a first film and a second film. The first film is provided on the second film. In the step of performing the first plasma processing, the first film is etched using the plasma of the processing gas. In the step of performing the second plasma processing, the second film is etched using the plasma of the processing gas. According to the sixth embodiment, it is possible to etch a multi-layer film having a film requiring relatively high energy for the etching as the first film and having a film capable of being etched with relatively low energy as the second film.

In a seventh embodiment based on any of the second to fourth embodiments, a substrate is disposed in the chamber during the first period. In the step of performing the first plasma processing, the film of the substrate is etched using the plasma of the processing gas. The substrate is not disposed in the chamber during the second period. The deposits adhered to the inner wall surface of the chamber are removed by using the plasma of the processing gas in the step of performing the second plasma processing. In the second period, the energy of ions toward the substrate support becomes lower, and the energy of ions toward the inner wall surface of the chamber becomes relatively higher. As a result, the deposits attached to the inner wall surface of the chamber are efficiently removed.

In an eighth embodiment based on the second embodiment, a substrate is disposed in the chamber during the first period and the second period. In the step of performing the first plasma processing, the film of the substrate is etched using the plasma of the processing gas to provide the side wall surface. In the step of performing the second plasma processing, deposits containing a chemical species from the plasma of the processing gas or a chemical species from plasma of another processing gas are formed on the surface of the substrate whose film has been etched in the step of performing the first plasma processing. The step of performing of the first plasma processing and the step of performing of the second plasma processing are alternately repeated. In the eighth embodiment, deposit formation and film etching are alternately performed. During the etching of the film, the side wall surfaces of the film are protected by the deposits.

In a ninth embodiment based on the second embodiment, a substrate is disposed in the chamber during the first period and the second period. In the step of performing the first plasma processing, the film of the substrate is etched using the plasma of the processing gas to provide the side wall surface. In the step of performing the second plasma processing, the surface of the film etched in the step of performing the first plasma processing is modified using the plasma of the processing gas or the plasma of another processing gas. The step of performing of the first plasma processing and the step of performing of the second plasma processing are alternately repeated. In the ninth embodiment, the modifying process of the film and the etching of the film are performed alternately. Since the side wall surface of the film is modified, the side wall surface is suppressed from being etched while the film is being etched.

In a tenth embodiment based on the first embodiment, the second radio-frequency power is supplied as a pulsed radio-frequency power in the first partial period of the first period and in the second partial period of the second period. The first partial period is included in a period in which the first radio-frequency power output from the first radio-frequency power supply has a positive voltage in each cycle of the first radio-frequency power. The second partial period is included in a period in which the first radio-frequency power output from the first radio-frequency power supply has a negative potential in each cycle of the first radio-frequency power. In the tenth embodiment, the energy of the ions towards the substrate support becomes higher during the first period and becomes lower during the second period.

In an eleventh embodiment based on the first embodiment, the second radio-frequency power is supplied as a pulsed radio-frequency power in a period in which the first radio-frequency power output from the first radio-frequency power supply has a positive voltage in each cycle of the first radio-frequency power in the first period. The second radio-frequency power is supplied as a continuous radio-frequency power in each cycle of the first radio-frequency power in the second period. In the eleventh embodiment, the energy of the ions towards the substrate support becomes higher during the first period and becomes lower during the second period.

In a twelfth embodiment based on the first embodiment, the second radio-frequency power is supplied as a continuous radio-frequency power in each cycle of the first radio-frequency power in the first period. The second radio-frequency power is supplied as a pulsed radio-frequency power in a period in which the first radio-frequency power output from the first radio-frequency power supply has a negative potential in each cycle of the first radio-frequency power in the second period. In the twelfth embodiment, the energy of the ions towards the substrate support becomes higher during the first period and becomes lower during the second period.

In a thirteenth embodiment based on any of the tenth to twelfth embodiments, a substrate is disposed in the chamber during the first period and the second period. The substrate has a first film and a second film, and the first film is provided on the second film. In the step of performing the first plasma processing, the first film is etched using the plasma of the processing gas. In the step of performing the second plasma processing, the second film is etched using the plasma of the processing gas. According to the thirteenth embodiment, it is possible to etch a multi-layer film having a film capable of being etched with relatively low energy as the first film and having a film requiring relatively high energy for the etching as the second film.

In a fourteenth embodiment based on the first embodiment, each of the first period and the second period has a time length that is the same as the time length of one cycle of the first radio-frequency power. The second radio-frequency power is supplied as a pulsed radio-frequency power in a period in which the first radio-frequency power output from the first radio-frequency power supply has a negative potential in the first period. The second radio-frequency power is not supplied within the second period. The step of performing the first plasma processing and the step of performing the second plasma processing are alternately repeated to etch the film of the substrate disposed in the chamber. According to the fourteenth embodiment, the ions generated in the first period collide with the substrate with high energy in the second period.

In a fifteenth embodiment based on the first embodiment, each of the first period and the second period has a time length that is the same as the time length of one cycle of the first radio-frequency power. The second radio-frequency power is supplied as a pulsed radio-frequency power in a period in which the first radio-frequency power output from the first radio-frequency power supply has a positive voltage in the first period. The second radio-frequency power is not supplied within the second period. The step of performing the first plasma processing and the step of performing the second plasma processing are alternately repeated to etch the film of the substrate disposed in the chamber. According to the fifteenth embodiment, the ions generated in the first period collide with the substrate with high energy in the second period.

In another embodiment, a plasma processing apparatus is provided. The plasma processing apparatus includes a chamber, a substrate support, a radio-frequency power supply, a second radio-frequency power supply, and a controller. The substrate support includes a lower electrode and is provided in the chamber. The first radio-frequency power supply is configured to supply a first radio-frequency power having a first frequency to the lower electrode. The second radio-frequency power supply is configured to supply a second radio-frequency power having a second frequency higher than the first frequency to generate plasma. The controller is configured to control the first radio-frequency power supply and the second radio-frequency power supply. The controller controls the first radio-frequency power supply to continuously supply the first radio-frequency power to the lower electrode during the first period and the second period after the first period or subsequent to the first period. The controller controls the second radio-frequency power supply so that the second radio-frequency power is supplied as a pulsed radio-frequency power in the first partial period of the first period, and the second radio-frequency power is supplied as a pulsed radio-frequency power in the second partial period of the second period. The first partial period is a part of each period of the first radio-frequency power. The second partial period is a part of each period of the first radio-frequency power and is different from the first partial period. Alternatively, the controller controls the second radio-frequency power supply so that the second radio-frequency power is supplied as one of a pulsed radio-frequency power and a continuous radio-frequency power in each cycle of the first radio-frequency power in the first period. Further, the controller controls the second radio-frequency power supply so that the second radio-frequency power is supplied as the other radio-frequency power in each cycle of the first radio-frequency power in the second period. Alternatively, the controller controls the second radio-frequency power supply so that the second radio-frequency power is supplied as a pulsed radio-frequency power in each cycle of the first radio-frequency power in the first period and the second radio-frequency power is not supplied in the second period.

Hereinafter, various embodiments will be described in detail with reference to the accompanying drawings. In each drawing, the same or corresponding parts are designated by the same reference numerals.

Figure 2:
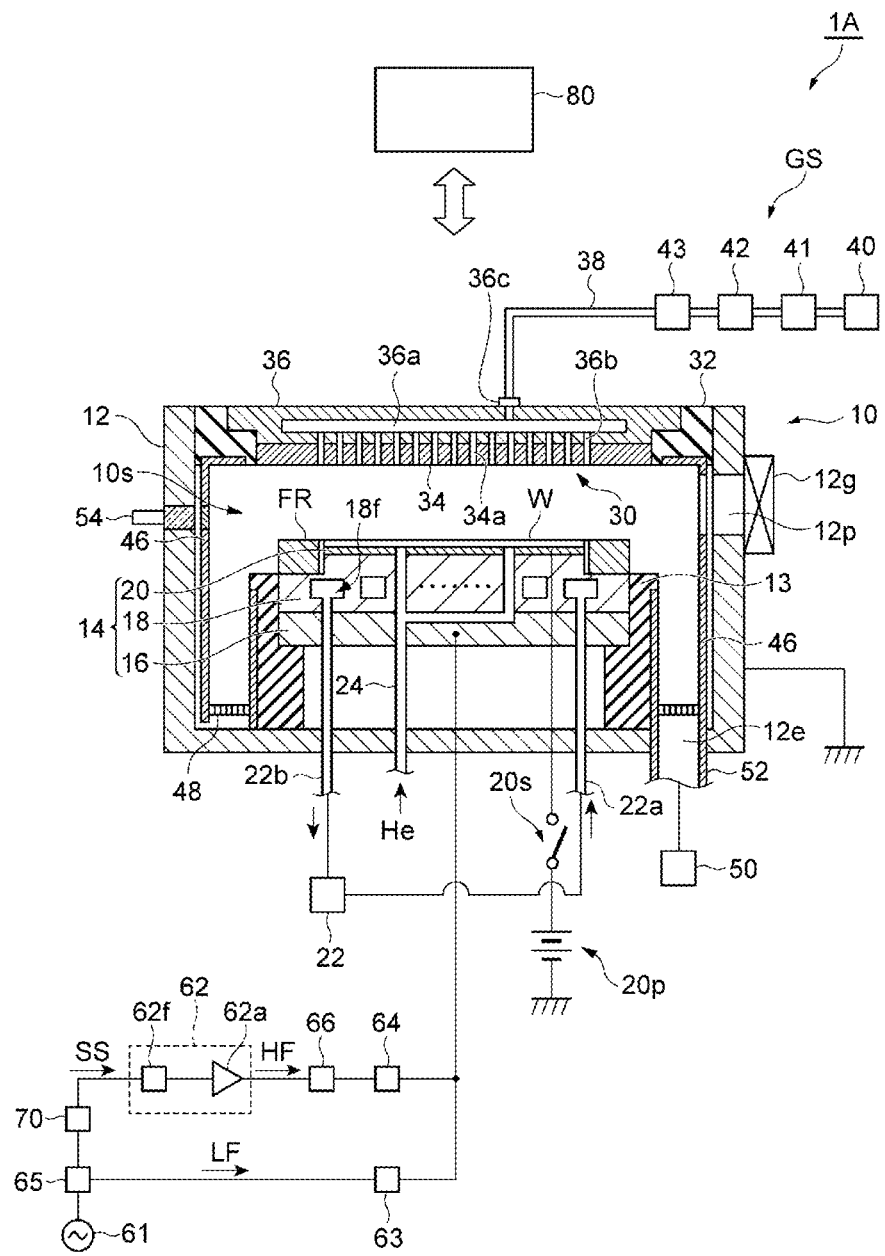
FIG. 2 is a diagram schematically illustrating a plasma processing apparatus according to the embodiment.

FIG. 1 is a flowchart of a plasma processing method according to an embodiment. The plasma processing method illustrated in FIG. 1 (hereinafter, referred to as a "method MT1") is performed using a plasma processing apparatus. FIG. 2 is a diagram schematically illustrating a plasma processing apparatus according to the embodiment. The plasma processing apparatus illustrated in FIG. 2 may be used to execute the plasma processing methods according to various embodiments of the present disclosure.

The plasma processing apparatus 1A illustrated in FIG. 2 is a capacitively coupled plasma processing apparatus. The plasma processing apparatus 1A further includes a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is made of, for example, aluminum. A film having corrosion resistance is provided on the inner wall surface of the chamber body 12. The film having corrosion resistance may be a film formed of a ceramic such as aluminum oxide or yttrium oxide.

A passage 12p is formed in the side wall of the chamber body 12. A substrate W passes through the passage 12p when being transferred between the internal space 10s and the outside of the chamber 10. The passage 12p may be opened and closed by a gate valve 12g. The gate valve 12g is provided along the side wall of the chamber body 12.

A support portion 13 is provided on the bottom of the chamber body 12. The support portion 13 is formed of an insulating material. The support portion 13 has a substantially cylindrical shape. The support portion 13 extends upward from the bottom of the chamber body 12 in the internal space 10s. The support portion 13 supports a substrate support, that is, a support 14. The support 14 is provided in the internal space 10s. The support 14 is configured to support the substrate W in the chamber 10, that is, in the internal space 10s.

The support 14 includes a lower electrode 18 and an electrostatic chuck 20. The support 14 may further include an electrode plate 16. The electrode plate 16 is formed of a conductive material such as, for example, aluminum and has a substantially disk shape. The lower electrode 18 is provided on the electrode plate 16. The electrode plate 18 is formed of a conductive material such as, for example, aluminum and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and electrodes. The main body of the electrostatic chuck 20 has a substantially disk shape and is formed of a dielectric material. The electrode of the electrostatic chuck 20 is a film-shaped electrode and is provided inside the main body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. Due to the generated electrostatic attraction, the substrate W is attracted to the electrostatic chuck 20 and held by the electrostatic chuck 20.

A focus ring FR is arranged on the peripheral portion of the lower electrode 18 to surround the edge of the substrate W. The focus ring FR is provided to improve the in-plane uniformity of plasma processing on the substrate W. The focus ring FR may be formed of, but not limited to, silicon, silicon carbide, or quartz.

A flow path 18*f* is formed in the lower electrode 18. A heat exchange medium (e.g., a coolant) is supplied to the flow path 18*f* from a chiller unit 22 provided outside the chamber 10 via a pipe 22*a*. The heat exchange medium supplied to the flow path 18*f* is returned to the chiller unit 22 through a pipe 22*b*. In the plasma processing apparatus 1A, the temperature of the substrate W placed on the electrostatic chuck 20 is adjusted by heat exchange between the heat exchange medium and the lower electrode 18.

A gas supply line 24 is provided in the plasma processing apparatus 1A. The gas supply line 24 supplies a heat transfer gas from a heat transfer gas supply mechanism (e.g., a He gas) between the upper surface of the electrostatic chuck 20 and the back surface of the substrate W.

The plasma processing apparatus 10 further includes an upper electrode 30. The upper electrode 30 is provided above the support 14. The upper electrode 30 is supported on the upper portion of the chamber body 12 via a member 32. The member 32 is made of an insulating material. The upper electrode 30 and the member 32 close the upper opening of the chamber body 12.

The upper electrode 30 may include a top plate 34 and a support body 36. The lower surface of the top plate 34 is the lower surface on the side of the internal space 10*s*, and defines the internal space 10*s*. The top plate 34 may be formed of a low-resistance electric conductor or semiconductor with low Joule heat. A plurality of gas discharge holes 34*a* is formed in the top plate 34. The plurality of gas discharge holes 34*a* penetrate the top plate 34 in the plate thickness direction.

The support body 36 detachably supports the top plate 34. The support body 36 is formed of a conductive material such as aluminum. A gas diffusion chamber 36*a* is provided inside the support body 36. A plurality of gas holes 34*a* is formed in the support body 36. The plurality of gas holes 36*b* extend downward from the gas diffusion chamber 36*a*. The plurality of gas holes 36*b* communicate with the plurality of gas discharge holes 34*a*, respectively. A gas introduction port 36*c* is formed in the support body 36. The gas introduction port 36*c* is connected to the gas diffusion chamber 36*a*. A gas supply pipe 38 is connected to the gas introduction port 36*c*.

The plasma processing apparatus 1A further includes a gas supply GS. The gas supply GS includes a gas source group 40, a valve group 41, a flow rate controller group 42, and a valve group 43. The gas source group 40 is connected to a gas supply pipe 38 via the valve group 41, the flow rate controller group 42, and the valve group 43. The gas source group 40 includes a plurality of gas sources. The plurality of gas sources include multiple gas sources utilized in each of the various embodiments. Each of the valve group 41 and the valve group 43 includes a plurality of open/close valves. The flow rate controller group 42 includes a plurality of flow rate controllers. Each of the plurality of flow rate controllers in the flow rate controller group 42 is a mass flow controller or a pressure control type flow rate controller. Each of the plurality of gas sources in the gas source group 40 is connected to the gas supply pipe 38 via a corresponding open/close valve of the valve group 41, a corresponding flow rate controller of the flow rate controller group 42, and a corresponding open/close valve of the valve group 43.

In the plasma processing apparatus 1A, a shield 46 is detachably provided along the inner wall surface of the chamber body 12. The shield 46 is also provided on the outer periphery of the support portion 13. The shield 46 prevents the etching by-product from adhering to the chamber body 12. The shield 46 is constituted by forming a film having corrosion resistance on the surface of a member made of, for example, aluminum. The film having corrosion resistance may be a film formed of a ceramic such as yttrium oxide.

A baffle plate 48 is provided between the support portion 13 and the side wall of the chamber body 12. The baffle plate 48 is constituted by forming a film having corrosion resistance on the surface of a member formed of, for example, aluminum. The film having corrosion resistance may be a film formed of a ceramic such as yttrium oxide. A plurality of through holes is formed in the baffle plate 48. An exhaust port 12*e* is provided below the baffle plate 48 and at the bottom of the chamber body 12. The exhaust port 12*e* is connected to an exhaust device 50 via an exhaust pipe 52. The exhaust device 50 has a vacuum pump such as a pressure control valve or a turbo molecular pump.

The plasma processing apparatus 1A may further include an emission analyzer 54. The emission analyzer 54 is provided outside the chamber 10. The emission analyzer 54 receives light from the plasma through an optically transparent window member formed in chamber 10. The emission analyzer 54 acquires emission intensity of one or more wavelengths of plasma. A controller 80 to be described later may end the process based on the emission intensity acquired by the emission analyzer 54.

The plasma processing apparatus 1A further includes a first radio-frequency power supply 61. The first radio-frequency power supply 61 is configured to output a first radio-frequency power LF. The first radio-frequency power LF has a frequency that is suitable mainly for attracting ions to the substrate W. The first frequency, which is the basic frequency of the first radio-frequency power LF, is within the range of, for example, 50 kHz to 13.56 MHz.

The first radio-frequency power supply 61 is electrically connected to the lower electrode 18 via a matching device 63. The matching device 63 has a matching circuit. The matching circuit of the matching device 63 is configured to match the impedance on the load side (lower electrode side) of the first radio-frequency power supply 61 with the output impedance of the first radio-frequency power supply 61.

According to an embodiment, the plasma processing apparatus 1A may further include a directional coupler 65. The directional coupler 65 is provided between the first radio-frequency power supply 61 and the matching device 63. In the plasma processing apparatus 1A, the directional coupler 65 is provided between the first radio-frequency power supply 61 and a synchronization signal generator 70. The directional coupler 65 branches the first radio-frequency power LF and supplies the power to the synchronization signal generator 70. Most of the first radio-frequency power LF supplied to the directional coupler 65 is supplied to the matching device 63. For example, the coupling degree of the directional coupler 65 is 60 dB.

The synchronization signal generator 70 is configured to generate a synchronization signal SS from the first radio-frequency power LF. Specifically, the synchronization signal generator 70 receives the branch power of the first radio-frequency power LF from the directional coupler 65. The synchronization signal generator 70 generates the synchronization signal SS from the voltage of the branch power of the first radio-frequency power LF. The synchronization signal SS includes a synchronization pulse that defines the start time of each cycle of the first radio-frequency power. In the embodiment, the synchronization signal generator 70 amplifies the voltage of the branch power of the first radio-frequency power LF with an amplifier and outputs an amplified signal. The amplified signal output from the amplifier is input to a comparator. The comparator of the synchronization signal generator 70 generates a synchronization clock signal from the amplified signal. The synchronization signal generator 70 generates a synchronization signal including a synchronization pulse at the rising edge of the synchronization clock signal.

The plasma processing apparatus 1A further includes a second radio-frequency power supply 62. The second radio-frequency power supply 62 is configured to output the second radio-frequency power HF in order to generate plasma from the gas in the chamber 10. The second frequency, which is the basic frequency of the second radio-frequency power HF, is higher than the first frequency. The second frequency is a frequency within the range of, for example, 27 MHz to 300 MHz.

The second radio-frequency power supply 62 is electrically connected to the lower electrode 18 via a matching device 64. The matching device 64 has a matching circuit. The matching circuit of the matching device 64 is configured to match the impedance on the load side (lower electrode side) of the second radio-frequency power supply 62 with the output impedance of the second radio-frequency power supply 62. The plasma processing apparatus 1A may further include a directional coupler 66. The directional coupler 66 is provided between the second radio-frequency power supply 62 and the matching device 64. In another embodiment, the second radio-frequency power supply 62 may be electrically connected to the upper electrode 30 via the matching device 64.

The plasma processing apparatus 1A may further include a controller 80. The controller 80 may be a computer including a processor, a storage such as a memory, an input device, a display device, and a signal input/output interface. The controller 80 controls each part of the plasma processing apparatus 1A. In the controller 80, an operator may use the input device to input a command in order to manage the plasma processing apparatus 1A. Further, in the controller 80, the display device may visualize and display the operating status of the plasma processing apparatus 1A. In addition, the storage of the controller 80 stores a control program and recipe data. The control program is executed by the processor of the controller 80 in order to execute various processes in the plasma processing apparatus 1A. The plasma processing method of each of the various embodiments is executed by the plasma processing apparatus 1A by the processor of the controller 80 executing the control program and controlling each unit of the plasma processing apparatus 1A according to the recipe data.

The second radio-frequency power supply 62 generates the second radio-frequency power HF in each cycle of the first radio-frequency power LF according to the control signal from the controller 80 and the synchronization signal SS from the synchronization signal generator 70, or stops the output of the second radio-frequency power HF. Each cycle of the first radio-frequency power LF is specified from the synchronization signal SS. The second radio-frequency power supply 62 is configured to generate the second radio-frequency power HF as a pulsed radio-frequency power or a continuous radio-frequency power. The pulsed radio-frequency power is a radio-frequency power whose power level is increased within a specific period in a certain period. For example, the power level of the pulsed radio-frequency power is greater than zero in a specific period in a certain period and zero in the periods before and after the specific period. The period during which the second radio-frequency power HF is output as a pulsed radio-frequency power within each cycle of the first radio-frequency power LF is designated by the control signal from the controller 80.

The second radio-frequency power supply 62 of the plasma processing apparatus 1A includes a radio-frequency signal generator 62f and an amplifier 62a. The radio-frequency signal generator 62f generates a radio-frequency signal or stops the output of the radio-frequency signal in each cycle of the first radio-frequency power LF according to the control signal from the controller 80 and the synchronization signal SS from the synchronization signal generator 70. Each cycle of the first radio-frequency power LF is specified from the synchronization signal SS. The radio-frequency signal generated by the radio-frequency signal generator 62f has a second frequency. The radio-frequency signal generator 62f generates the radio-frequency signal as a pulsed radio-frequency signal or a continuous radio-frequency signal. The period during which the radio-frequency signal is output as a pulsed radio-frequency signal within each cycle of the first radio-frequency power LF is designated by the control signal from the controller 80. The radio-frequency signal generator 62f is, for example, a function generator. The radio-frequency signal generated by the radio-frequency signal generator 62f is input to the amplifier 62a. In the second radio-frequency power supply 62 of the plasma processing apparatus 1A, the second radio-frequency power HF is generated by amplifying the radio-frequency signal by the amplifier 62a.

Figure 3:
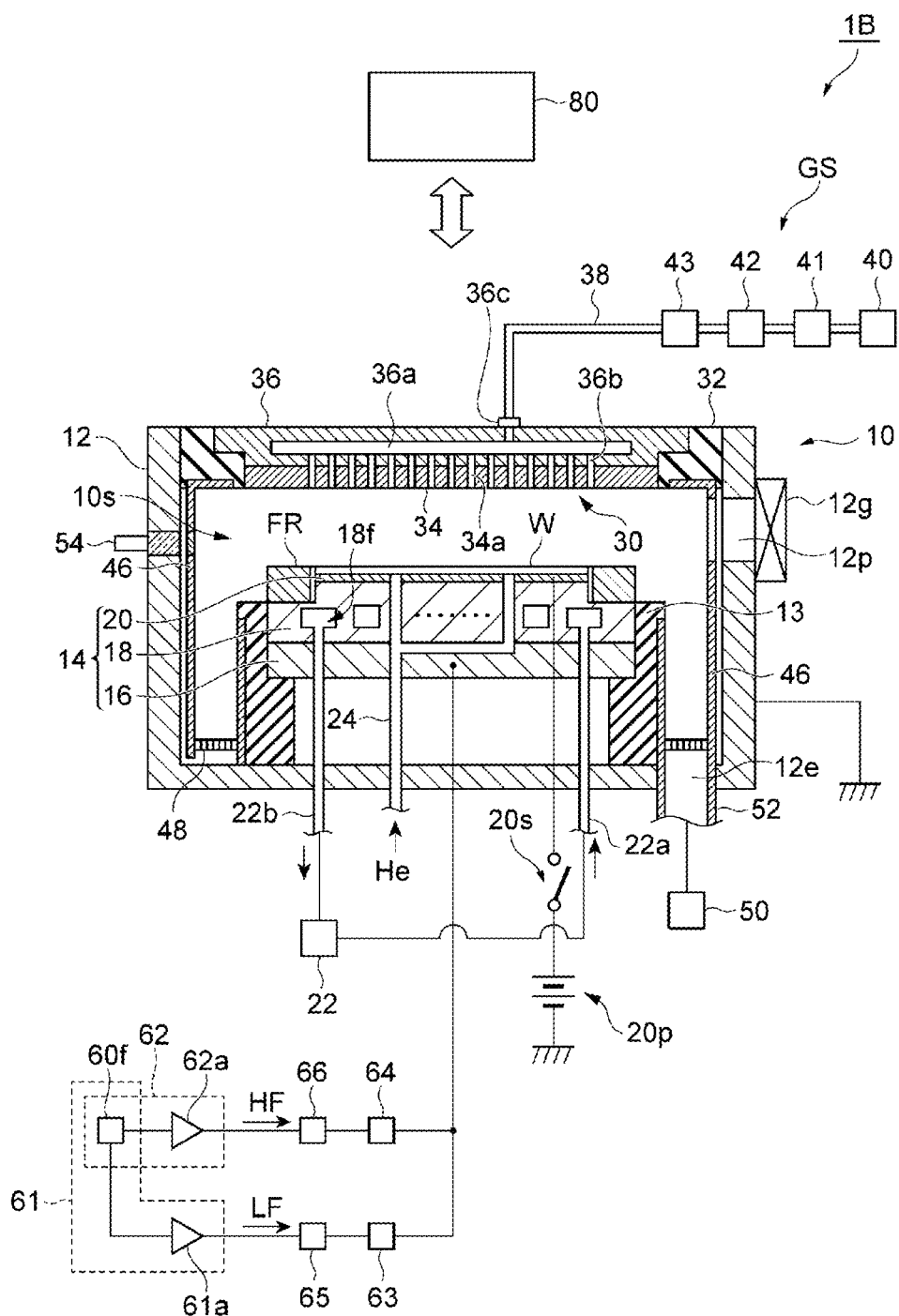
FIG. 3 is a diagram schematically illustrating a plasma processing apparatus according to another embodiment.

The plasma processing method of each of the various embodiments may be performed using the plasma processing apparatus illustrated in FIG. 3. FIG. 3 is a diagram schematically illustrating a plasma processing apparatus according to another embodiment. Hereinafter, a plasma processing apparatus 1B will be described with respect to differences between the plasma processing apparatus 1A and the plasma processing apparatus 1B illustrated in FIG. 3. In the plasma processing apparatus 1B, the first radio-frequency power supply 61 includes a radio-frequency signal generator 60f and an amplifier 61a. The radio-frequency signal generator 60f generates a first radio-frequency signal as a continuous radio-frequency signal. The first radio-frequency power has a first frequency. The radio-frequency signal generator 60f is, for example, a function generator. The first radio-frequency signal is input to the amplifier 61a. In the plasma processing apparatus 1B, the first radio-frequency power LF is generated by amplifying the first radio-frequency signal by the amplifier 61a.

In the plasma processing apparatus 1B, the second radio-frequency power supply 62 includes the radio-frequency signal generator 60f and the amplifier 62a. That is, the second radio-frequency power supply 62 shares the radio-frequency signal generator 60f with the first radio-frequency power supply 61. Therefore, the first radio-frequency power supply 61 and the second radio-frequency power supply 62 are synchronized with each other. The radio-frequency signal generator 60f generates a second radio-frequency signal in addition to the first radio-frequency signal. The second radio-frequency signal generated by the radio-frequency signal generator 60f has a second frequency.

The radio-frequency signal generator 60f generates the second radio-frequency signal or stops the output of the second radio-frequency signal within each cycle of the first radio-frequency power LF, according to the control signal from the controller 80. The radio-frequency signal generator 60f may perform a timing control of the output of the second radio-frequency signal for each cycle of the first radio-frequency signal. Since the radio-frequency signal generator 60f itself generates the first radio-frequency signal, a separate synchronization signal generator is not required to specify each cycle of the first radio-frequency power LF.

The radio-frequency signal generator 60f generates the second radio-frequency signal as a pulsed radio-frequency signal or a continuous radio-frequency signal. The period during which the second radio-frequency signal is output as a pulsed radio-frequency signal within each cycle of the first radio-frequency power LF is designated by the control signal from the controller 80. The second radio-frequency signal generated by the radio-frequency signal generator 60f is input to the amplifier 62a. In the second radio-frequency power supply 62 of the plasma processing apparatus 1B, the second radio-frequency power HF is generated by amplifying the second radio-frequency signal by the amplifier 62a.

Figure 4A:
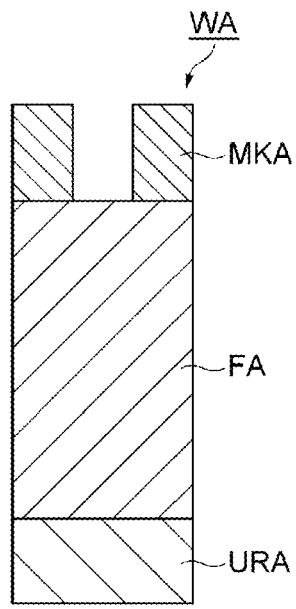
FIG. 4A is a partially enlarged cross-sectional view of an example substrate.
Figure 4B:
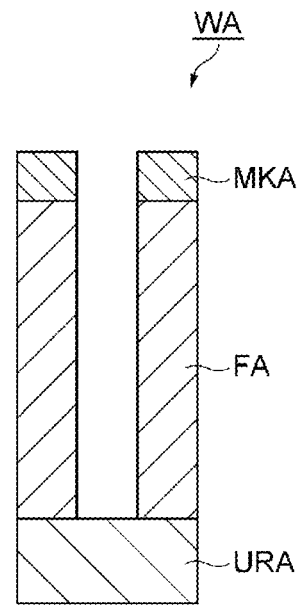
FIGS. 4B and 4C are partially enlarged cross-sectional views of the example substrate in a state after performing each of a plurality of steps of a method MT1.
Figure 4C:
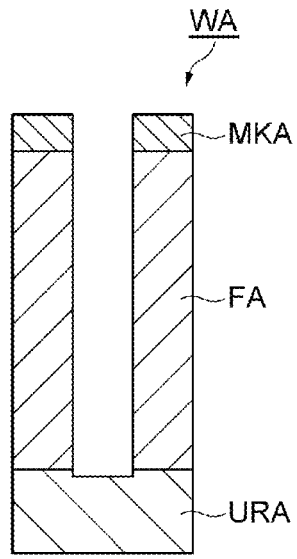
Figure 5:
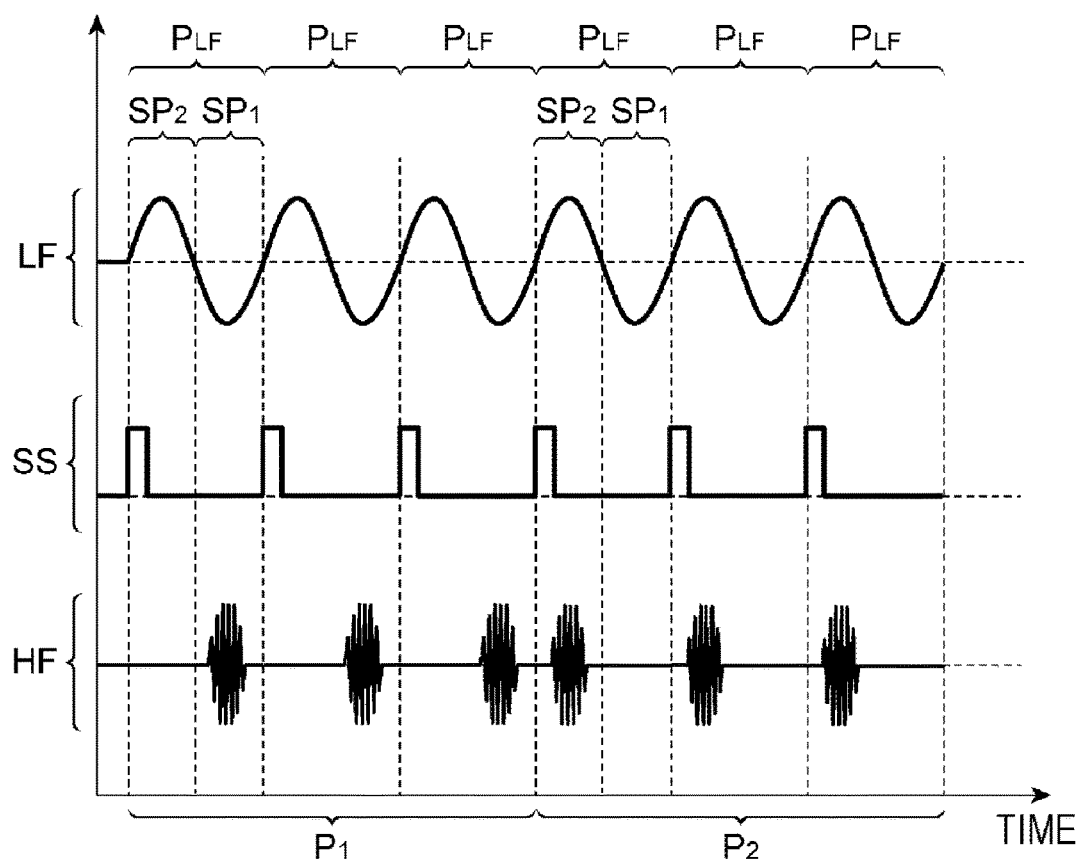
FIG. 5 is a timing chart of an example related to the method MT1.

Hereinafter, the plasma processing methods according to various embodiments will be described in detail by taking the case where either the plasma processing apparatus 1A or the plasma processing apparatus 1B is used as an example. In the following descriptions, FIGS. 4A to 4C and FIG. 5 will be referred to together with FIG. 1. FIG. 4A is a partially enlarged cross-sectional view of an example substrate, and FIGS. 4B and 4C are partially enlarged cross-sectional views of the example substrate in a state after performing each of a plurality of steps of a method MT1. FIG. 5 is a timing chart of an example related to the method MT1. In FIG. 5, the vertical axis represents the first radio-frequency power LF, the synchronization signal SS, and the second radio-frequency power HF.

The method MT1 includes steps ST11 and ST12. The step ST11 is executed in the first period $P_1$. The time length of the first period $P_1$ may be m times the time length of one cycle of the first radio-frequency power LF. m is a natural number. In the step ST11, the first plasma processing is performed. The step ST12 is executed in the second period $P_2$. The second period $P_2$ is a period following the first period $P_1$. In the step ST12, the second plasma processing is performed. The time length of the second period $P_2$ may be m times the time length of one cycle of the first radio-frequency power LF. n is a natural number.

In the steps ST11 and ST12, the processing gas is supplied into the chamber 10. In the steps ST11 and ST12, the gas supply GS is controlled by the controller 80 to supply the processing gas. In the steps ST11 and ST12, the exhaust device 50 is controlled by the controller 80 to set the pressure in the chamber 10 to the designated pressure. The pressure in the chamber 10 is set to a pressure within the range of, for example, several mTorr to 1,000 mTorr.

In the steps ST11 and ST12, the first radio-frequency power LF is continuously supplied to the lower electrode 18. That is, in the method MT1, the first radio-frequency power LF is continuously supplied to the lower electrode 18 during the first period $P_1$ and the second period $P_2$. In the steps ST11 and ST12, the first radio-frequency power supply 61 is controlled by the controller 80 in order to supply the first radio-frequency power LF to the lower electrode 18.

The second radio-frequency power HF is supplied to the lower electrode 18 (or the upper electrode 30) as a pulsed radio-frequency power in a first partial period $SP_1$ (i.e., first half cycle) in the first period $P_1$ and in a second partial period $SP_2$ (i.e., second half cycle) in the second period $P_2$. That is, the second radio-frequency power HF is supplied as a pulsed radio-frequency power in the first partial period $SP_1$ in the step ST11. Further, the second radio-frequency power HF is supplied as a pulsed radio-frequency power in the second partial period $SP_2$ in the step ST12. In the steps ST11 and ST12, the second radio-frequency power supply 62 is controlled by the controller 80 in order to supply the second radio-frequency power LF.

The first partial period $SP_1$ is a part of each period $P_{LF}$ of the first radio-frequency power LF. The second partial period $SP_2$ is a partial period within each cycle $P_{LF}$ of the first radio-frequency power LF and is different from the first partial period. In the method MT1, the first partial period $SP_1$ is included in a period in which the first radio-frequency power LF output from the first radio-frequency power supply 61 has a negative potential in each period $P_{LF}$ of the first radio-frequency power LF (hereinafter, referred to as a "negative voltage output period"). In the method MT1, the second partial period $SP_2$ is included in a period in which the first radio-frequency power LF output from the first radio-frequency power supply 61 has a positive voltage in each period $P_{LF}$ of the first radio-frequency power LF (hereinafter, referred to as a "positive voltage output period").

The second radio-frequency power supply 62 may supply a pulsed radio-frequency power at an appropriate timing in accordance with a command from the controller 80 in each cycle $P_{LF}$ specified by the synchronization signal SS. Therefore, in each of a plurality of first partial periods $SP_1$, the pulsed radio-frequency power may be supplied in the same phase relative to the cycle of the first radio-frequency power LF. In addition, in each of a plurality of second partial periods $SP_2$, the pulsed radio-frequency power may be supplied in the same phase relative to the cycle of the first radio-frequency power LF.

In various embodiments, the partial period set within the negative voltage output period (the first partial period $SP_1$ or the second partial period $SP_2$) may include a time point when the first radio-frequency power LF has the minimum potential in each cycle $P_{LF}$ of the first radio-frequency power LF. The partial period set within the positive voltage output period (the first partial period $SP_1$ or the second partial period $SP_2$) may include a time point when the first radio-frequency power LF has the maximum potential in each cycle $P_{LF}$ of the first radio-frequency power LF.

In the steps ST11 and ST12, a plasma is formed from the processing gas in the chamber 10. In the step ST11, the second radio-frequency power HF is supplied as a pulsed radio-frequency power within the negative voltage output period. Therefore, in the step ST11, $V_{pp}$ (crest value of voltage) of the substrate on the support 14 becomes higher, and the energy of ions from the plasma toward the support 14 becomes relatively higher.

Meanwhile, in the step ST12, the second radio-frequency power HF is supplied as a pulsed radio-frequency power within the positive voltage output period. Therefore, in the step ST12, the $V_{pp}$ of the substrate on the support 14 becomes lower, and the energy of ions from the plasma toward the support 14 becomes relatively lower.

As illustrated in FIG. 4A, a substrate WA to which the method MT1 is applicable has a base region URA and a film FA. The film EF is provided on the base region URA. The substrate WA may further include a mask MKA. The mask MKA is provided on the film FA. The mask MKA is patterned to partially expose the film FA. In an example, the base region URA is formed of silicon, the film FA is formed of silicon oxide, and the mask MKA has a multi-layer structure including a photoresist film and an anti-reflection film. The anti-reflection film of the mask MKA is provided on the film FA. The anti-reflection film of the mask MKA contains silicon. The photoresist film of the mask MKA is provided on the anti-reflection film of the mask MKA.

In the method MT1, the substrate WA is disposed in the chamber 10 during the first period $P_1$ and the second period $P_2$. The substrate WA is placed on the support 14 in the chamber 10. The processing gas used in the steps ST11 and ST12 may include a fluorocarbon gas such as $C_4F_8$ gas. The processing gas used in the steps ST11 and ST12 may further include an oxygen-containing gas such as $O_2$ gas and/or a rare gas such as argon gas.

As illustrated in FIG. 4B, in the step ST11, the film FA is etched by the ions from the plasma to expose the base region URA. When it is determined from the emission intensity obtained by the emission analyzer 54 that the etching amount of the film FA has decreased, the step ST11 is ended. For example, when the emission intensity of CO acquired by the emission analyzer 54 is determined to be equal to or lower than a predetermined value, the step ST11 is ended. Alternatively, the step ST11 is ended after a lapse of a predetermined time. In the step ST11, since ions of high energy are supplied to the substrate WA, the film FA is etched at high speed.

In the subsequent step ST12, the film FA is over-etched as illustrated in FIG. 4C. In the step ST12, since ions of low energy are supplied to the substrate WA, over-etching of the film FA may be performed while suppressing damage to the base region URA.

Figure 6:
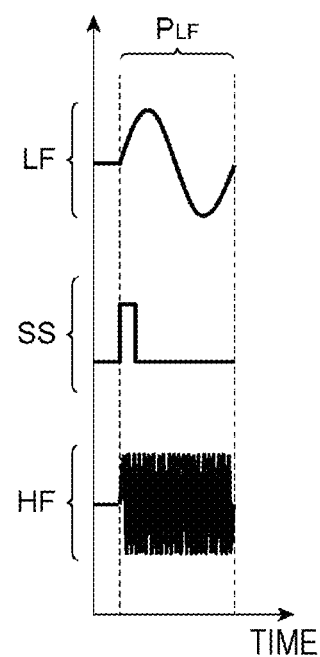
FIG. 6 is a timing chart illustrating an example of a second radio-frequency power as a continuous radio-frequency power.

Reference is made to FIG. 6. FIG. 6 is a timing chart illustrating an example of a second radio-frequency power as a continuous radio-frequency power. In the method MT1, the second radio-frequency power HF may be supplied as one of a pulsed radio-frequency power and a continuous radio-frequency power in each period $P_{LF}$ in the first period $P_1$, and supplied as the other radio-frequency power in each period $P_{LF}$ in the second period $P_2$. Specifically, in the method MT1, the second radio-frequency power HF may be supplied as a pulsed radio-frequency power in the negative voltage output period in the first period $P_1$ and supplied as a continuous radio-frequency power in the second period $P_2$. Also in this case, the energy of the ions toward the support 14 becomes relatively higher within the first period $P_1$ and relatively lower within the second period $P_2$.

Alternatively, in the method MT1, the second radio-frequency power HF may be supplied as a continuous radio-frequency power in the first period $P_1$ and supplied as a pulsed radio-frequency power in the positive voltage output period in the second period $P_2$. Also in this case, the energy of the ions toward the support 14 becomes relatively higher within the first period $P_1$ and relatively lower within the second period $P_2$.

Figure 7:
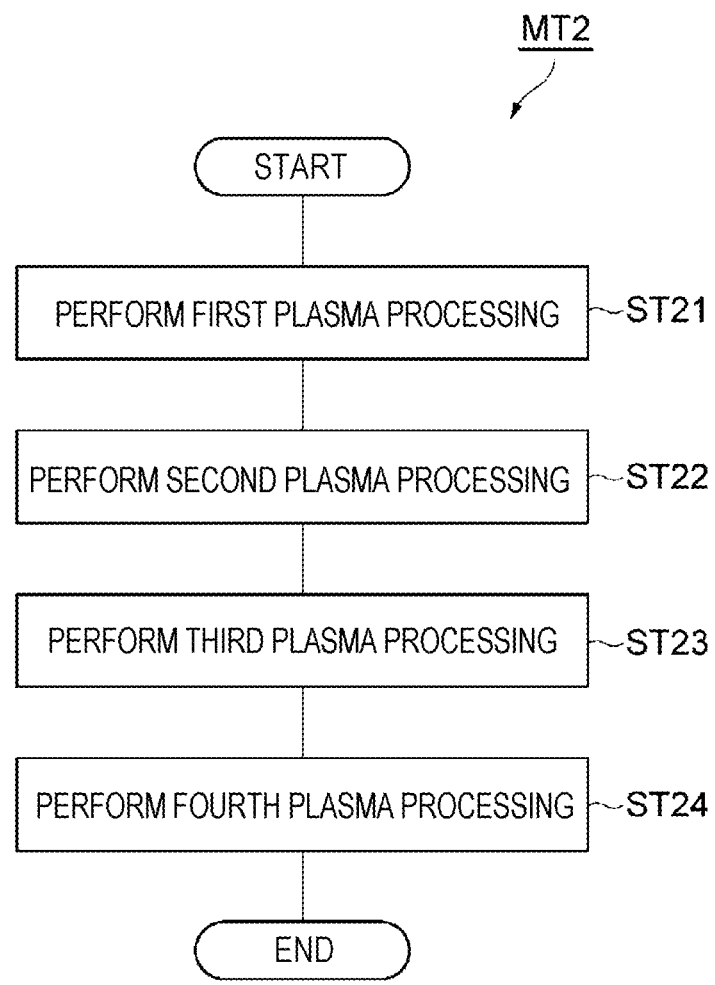
FIG. 7 is a flowchart of a plasma processing method according to another embodiment.
Figure 8A:
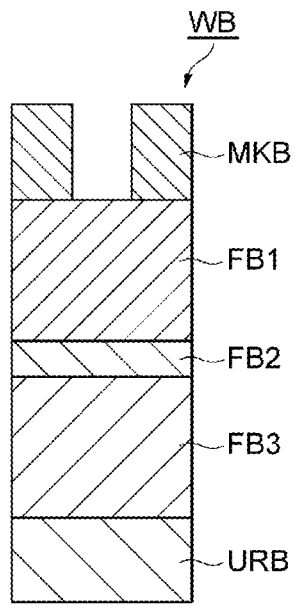
FIG. 8A is a partially enlarged cross-sectional view of an example substrate.

Next, reference is made to FIGS. 7, 8A, 8B, 8C, 8D, and 8E. FIG. 7 is a flowchart of the plasma processing method according to another embodiment. FIG. 8A is a partially enlarged cross-sectional view of an example substrate. FIGS. 8B to 8E are partially enlarged cross-sectional views of the example substrate in a state after performing each of the plurality of steps of the method MT2 illustrated in FIG. 7.

The method MT2 illustrated in FIG. 7 includes a step ST21 and a step ST22. The step ST21 is executed in the first period $P_1$ like the step ST11 of the method MT1. In the step ST21, the first plasma processing is performed. The step ST22 is executed in the first period $P_2$ like the step ST12 of the method MT1. The second period $P_2$ is a period following the first period $P_1$. In the step ST12, the second plasma processing is performed.

The method MT2 may further include a step ST23 and a step ST24. The step ST23 is executed in a third period. The third period is a period following the second period $P_2$. The time length of the third period may be p times the time length of one cycle of the first radio-frequency power LF. p is a natural number. In the step ST23, the third plasma processing is performed. The step ST24 is executed in a fourth period. The fourth period is a period following the third period $P_3$. The time length of the fourth period may be q times the time length of one cycle of the first radio-frequency power LF. q is a natural number. In the step ST24, the fourth plasma processing is performed.

In the steps ST21, ST22, ST23, and ST24, the processing gas is supplied into the chamber 10. In the steps ST21, ST22, ST23, and ST24, the gas supply GS is controlled by the controller 80 in order to supply the processing gas. In the steps ST21, ST22, ST23, and ST24, the exhaust device 50 is controlled by the controller 80 to set the pressure inside the chamber 10 to the designated pressure. The pressure in the chamber 10 is set to a pressure within the range of, for example, several mTorr to 1,000 mTorr.

In the steps ST21, ST22, ST23, and ST24, the first radio-frequency power LF is continuously supplied to the lower electrode 18. That is, in the method MT2, the first radio-frequency power LF is continuously supplied to the lower electrode 18 during the first period to the fourth period. In the steps ST21, ST22, ST23, and ST24, the first radio-frequency power supply 61 is controlled by the controller 80 in order to supply the first radio-frequency power LF to the lower electrode 18.

In the method MT2, the second radio-frequency power HF is supplied as a pulsed radio-frequency power within the first partial period $SP_1$ in each of the first period $P_1$ and the third period. Further, in the method MT2, the second radio-frequency power HF is supplied to the lower electrode 18 (or the upper electrode 30) within the second partial period $SP_2$ in each of the second period $P_2$ and the fourth period. That is, the second radio-frequency power HF is supplied as a pulsed radio-frequency power in the first partial period $SP_1$ in each of the steps ST21 and ST23. Further, the second radio-frequency power HF is supplied as a pulsed radio-frequency power in the second partial period $SP_2$ in each of the steps ST22 and ST24. In the steps ST21, ST22, ST23, and ST24, the second radio-frequency power supply 62 is controlled by the controller 80 in order to supply the second radio-frequency power HF.

In the method MT2, the first partial period $SP_1$ is included in the negative voltage output period within each cycle $P_{LF}$ of the first radio-frequency power LF. In the method MT2, the second partial period $SP_2$ is included in the positive voltage output period within each cycle $P_{LF}$ of the first radio-frequency power LF.

In the steps ST21, ST22, ST23, and ST24, the plasma is formed from the processing gas in the chamber 10. In the steps ST21 and ST23, the second radio-frequency power HF is supplied as a pulsed radio-frequency power within the negative voltage output period. Therefore, in the steps ST21 and ST23, the $V_{pp}$ of the substrate on the support 14 becomes higher, and the energy of the ions from the plasma toward the support 14 becomes relatively higher.

Meanwhile, in the steps ST22 and ST24, the second radio-frequency power HF is supplied as a pulsed radio-frequency power within the positive voltage output period. Therefore, in the steps ST22 and ST24, the $V_{pp}$ of the substrate on the support 14 becomes lower, and the energy of the ions from the plasma toward the support 14 becomes relatively lower.

As illustrated in FIG. 8A, a substrate WB to which the method MT2 is applicable has a first film FB1 and a second film FB2. The first film FB1 is provided on the second film FB2. The substrate WB may further include a base region URB, a third film FB3, and a mask MKB. The third film FB3 is provided on the base region URB. The second film FB2 is provided on the third film FB3. The mask MKB is provided on the first film FB1. The mask MKB is patterned to partially expose the first film FB1. In an example, the base region URB is formed of silicon. The first film FB1 and the third film FB3 are formed of silicon oxide. The second film FB2 is formed of silicon nitride. The mask MKB is formed of a photoresist film.

In the method MT2, the substrate WB is disposed in the chamber 10 during the first period to the fourth period. The substrate WB is placed on the support 14 in the chamber 10. The processing gas used in the steps ST21, ST22, ST23, and ST24 may include a fluorocarbon gas such as $C_4F_8$ gas. The processing gas used in the steps ST21, ST22, ST23, and ST24 may further include an oxygen-containing gas such as $O_2$ gas and/or a rare gas such as argon gas.

Figure 8B:
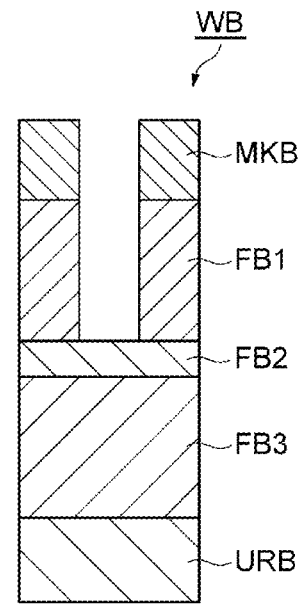
FIGS. 8B to 8E are partially enlarged cross-sectional views of the example substrate in a state after performing each of a plurality of steps of a method MT2.

As illustrated in FIG. 8B, in the step ST21, ions from the plasma are applied to the first film FB1 and the first film FB1 is etched by chemical ion etching so as to expose the second film FB2. When it is determined from the emission intensity obtained by the emission analyzer 54 that the etching amount of the first film FB1 has decreased, the step ST21 is ended. For example, when it is determined that the emission intensity of CO acquired by the emission analyzer 54 is equal to or lower than a predetermined value, or the emission intensity of CN acquired by the emission analyzer 54 is equal to or higher than another predetermined value, the step ST21 is ended. Alternatively, the step ST21 is ended after a lapse of a predetermined time.

Figure 8C:
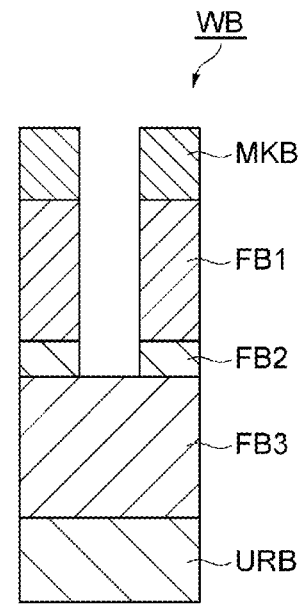

As illustrated in FIG. 8C, in the step ST22, ions from the plasma are applied to the second film FB2 and the second film FB2 is etched by chemical ion etching so as to expose the third film FB3. When it is determined from the emission intensity obtained by the emission analyzer 54 that the etching amount of the second film FB2 has decreased, the step ST22 is ended. For example, when it is determined that the emission intensity of CN acquired by the emission analyzer 54 is equal to or lower than a predetermined value, or the emission intensity of CO acquired by the emission analyzer 54 is equal to or higher than another predetermined value, the step ST22 is ended. Alternatively, the step ST22 is ended after a lapse of a predetermined time.

Figure 8D:
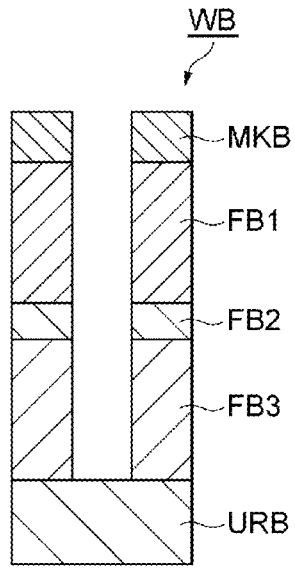

As illustrated in FIG. 8D, in the step ST23, ions from the plasma are applied to the third film FB3 and the third film FB3 is etched by chemical ion etching so as to expose the base region URB. When it is determined from the emission intensity obtained by the emission analyzer 54 that the etching amount of the third film FB3 has decreased, the step ST23 is ended. For example, when the emission intensity of CO acquired by the emission analyzer 54 is determined to be equal to or lower than a predetermined value, the step ST23 is ended. Alternatively, the step ST23 is ended after a lapse of a predetermined time.

Figure 8E:
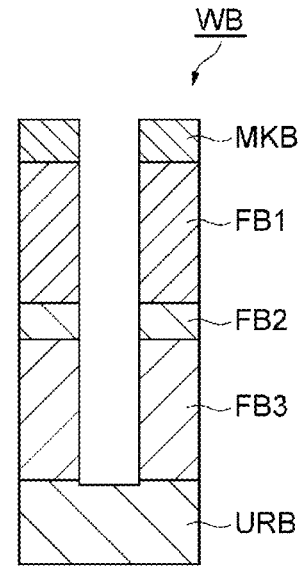

In the subsequent step ST24, the third film FB3 is over-etched as illustrated in FIG. 8E. In the step ST24, since ions of low energy are supplied to the substrate WB, over-etching of the third film FB3 may be performed while suppressing damage to the base region URB.

According to the method MT2, it is possible to etch a multi-layer film having a film requiring relatively high energy for the etching as the first film FB1 and having a film capable of being etched with relatively low energy as the second film FB2. In addition, it is possible to etch a multi-layer film that further has, as the third film FB3, a film requiring relatively high energy for etching between the second film FB2 and the base region URB.

In the method MT2, the second radio-frequency power HF may be supplied as one of a pulsed radio-frequency power and a continuous radio-frequency power in each period $P_{LF}$ in the first period $P_1$, and supplied as the other radio-frequency power in each period $P_{LF}$ in the second period $P_2$. Further, in the method MT2, the second radio-frequency power HF may be supplied as one of a pulsed radio-frequency power and a continuous radio-frequency power in each period $P_{LF}$ in the third period, and supplied as the other radio-frequency power in each period $P_{LF}$ in the fourth period.

Specifically, in the method MT2, the second radio-frequency power HF may be supplied as a pulsed radio-frequency power in the negative voltage output period in the first period and the third period, and supplied as a continuous radio-frequency power in the second period and the fourth period. Also in this case, the energy of the ions toward the support 14 becomes relatively higher within the first period and the third period and relatively lower within the second period and the fourth period.

Alternatively, in the method MT2, the second radio-frequency power HF may be supplied as a continuous radio-frequency power in the first period and the third period, and supplied as a pulsed radio-frequency power in the positive voltage output period in the second period and the fourth period. Also in this case, the energy of the ions toward the support 14 becomes relatively higher within the first period and the third period and relatively lower within the second period and the fourth period.

Figure 9:
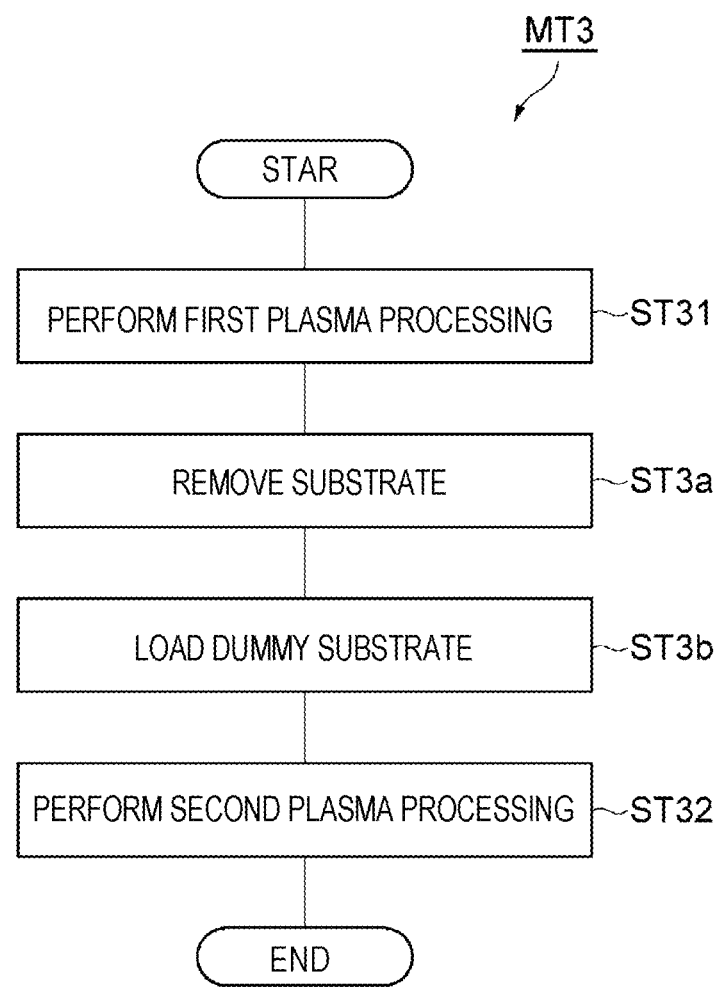
FIG. 9 is a flowchart of a plasma processing method according to still another embodiment.
Figure 10A:
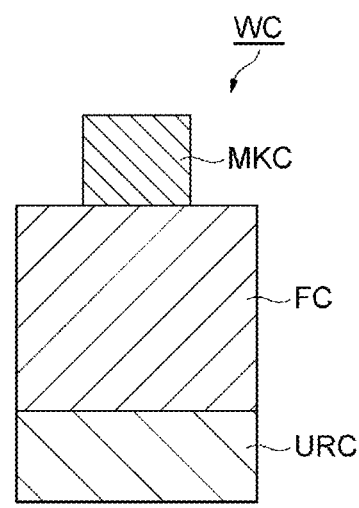
FIG. 10A is a partially enlarged cross-sectional view of an example substrate.
Figure 10B:
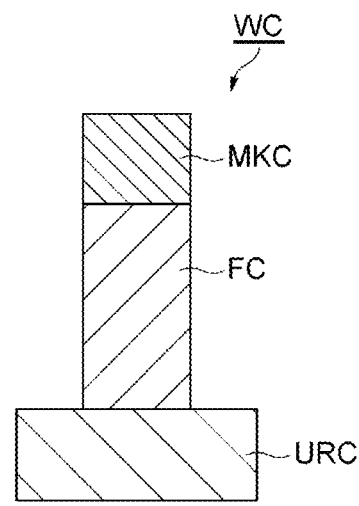
FIG. 10B is a partially enlarged cross-sectional view of the example substrate in a state after performing a step ST31 of a method MT3 illustrated in FIG. 9.

Subsequently, reference is made to FIGS. 9, 10A, and 10B. FIG. 9 is a flowchart of a plasma processing method according to still another embodiment. FIG. 10A is a partially enlarged cross-sectional view of an example substrate. FIG. 10B is a partially enlarged cross-sectional view of the example substrate in a state after performing the step ST31 of the method MT3 illustrated in FIG. 9.

The method MT3 illustrated in FIG. 9 includes a step ST31 and a step ST32. The step ST31 is executed in the first period $P_1$ like the step ST11 of the method MT1. In the step ST31, the first plasma processing is performed. The step ST32 is executed in the first period $P_2$ like the step ST12 of the method MT1. The second period $P_2$ is a period subsequent to or following the first period $P_1$. In the step ST32, the second plasma processing is performed.

In the steps ST31 and ST32, the processing gas is supplied into the chamber 10. In the steps ST31 and ST32, the gas supply GS is controlled by the controller 80 to supply the processing gas. In the steps ST31 and ST32, the exhaust device 50 is controlled by the controller 80 to set the pressure in the chamber 10 to the designated pressure.

In the steps ST31 and ST32, the first radio-frequency power LF is continuously supplied to the lower electrode 18. That is, in the method MT3, the first radio-frequency power LF is continuously supplied to the lower electrode 18 during the first period $P_1$ and the second period $P_2$. In the step ST31 and ST32, the first radio-frequency power supply 61 is controlled by the controller 80 in order to supply the first radio-frequency power LF to the lower electrode 18.

The second radio-frequency power HF is supplied to the lower electrode 18 (or the upper electrode 30) as a pulsed radio-frequency power in a first partial period $SP_1$ in the first period $P_1$ and in a second partial period $SP_2$ in the second period $P_2$. That is, the second radio-frequency power HF is supplied as a pulsed radio-frequency power in the first partial period $SP_1$ in the step ST31. Further, the second radio-frequency power HF is supplied as a pulsed radio-frequency power in the second partial period $SP_2$ in the step ST32. In the steps ST31 and ST32, the second radio-frequency power supply 62 is controlled by the controller 80 in order to supply the second radio-frequency power HF.

In the method MT3, the first partial period $SP_1$ is included in the negative voltage output period within each cycle $P_{LF}$ of the first radio-frequency power LF. In the method MT3, the second partial period $SP_2$ is included in the positive voltage output period within each cycle $P_{LF}$ of the first radio-frequency power LF.

In the steps ST31 and ST32, a plasma is formed from the processing gas in the chamber 10. In the step ST31, the second radio-frequency power HF is supplied as a pulsed radio-frequency power within the negative voltage output period. Therefore, in the step ST31, the $V_{pp}$ of the substrate on the support 14 becomes higher, and the energy of ions from the plasma toward the support 14 becomes relatively higher.

Meanwhile, in the step ST32, the second radio-frequency power HF is supplied as a pulsed radio-frequency power within the positive voltage output period. Therefore, in the step ST32, the $V_{pp}$ of the substrate on the support 14 becomes lower, and the energy of ions from the plasma toward the support 14 becomes relatively lower. In the step ST32, a radical-based etching is performed. Further, in the step ST32, the energy of the ions toward the inner wall surface of the chamber 10, that is, the inner wall surface defining the internal space 10s, becomes relatively higher.

As illustrated in FIG. 10A, a substrate WC to which the method MT3 is applicable has a base region URC and a film FC. The film FC is provided on the base region URC. The substrate WC may further include a mask MKC. The mask MKC is provided on the film FC. The mask MKC is patterned to partially expose the film FC. In an example, the base region URC is formed of TaN, the film FC is a multi-layer film including magnetic layers, and the mask MKC is formed of silicon oxide. The multi-layer film of the film FC is, for example, a multi-layer film that constitutes the MRAM element portion, and includes a magnetic tunnel junction (MTJ) structure.

In the method MT1, the substrate WC is disposed in the chamber 10 during the first period $P_1$. The substrate WC is placed on the support 14 in the chamber 10. The processing gas used in the steps ST31 and ST32 may be a mixed gas containing a rare gas such as $Cl_2$ gas or argon gas, or a mixed gas containing CO gas and $NH_3$ gas.

As illustrated in FIG. 10B, in the step ST31, the film FC is irradiated with ions from the plasma, and the film FC is etched by chemical ion etching and/or sputtering so as to expose the base region URC. When it is determined from the emission intensity obtained by the emission analyzer 54 that the etching amount of the film FC has decreased, the step ST31 is ended. Alternatively, the step ST31 is ended after a lapse of a predetermined time. In the step ST31, since ions of high energy are supplied to the substrate WC, it is possible to etch the film FC formed of the material which is difficult to etch.

The method MT3 may further include a step ST3a. The step ST3a is executed between the step ST31 and the step ST32. In the step ST3a, the substrate WC is unloaded from the internal space 10s of the chamber 10. Therefore, the step ST32 may be performed in a state where the substrate WC is not disposed in the chamber 10. The method MT3 may further include a step ST3b. The step ST3b is executed between the step ST3a and the step ST32. In the step ST3b, a dummy substrate is loaded into the chamber 10. The dummy substrate is placed on the support 14. Therefore, the step ST32 may be executed in a state in which the dummy substrate is placed on the support 14.

In the step ST31, deposits adhere to the inner wall surface of the chamber 10. The deposit may be an etching by-product. In the step ST32, the deposits attached to the inner wall surface of the chamber 10 are removed by chemical species such as ions and/or radicals from plasma. In the second period $P_2$ in which the step ST32 is performed, the energy of ions toward the support 14 becomes lower, and the energy of ions toward the inner wall surface of the chamber 10 becomes relatively higher. As a result, the deposits attached to the inner wall surface of the chamber are efficiently removed.

In the method MT3, the second radio-frequency power HF may be supplied as one of a pulsed radio-frequency power and a continuous radio-frequency power in each period $P_{LF}$ in the first period $P_1$, and supplied as the other radio-frequency power in each period $P_{LF}$ in the second period $P_2$. Specifically, in the method MT3, the second radio-frequency power HF may be supplied as a pulsed radio-frequency power in the negative voltage output period in the first period $P_1$ and supplied as a continuous radio-frequency power in the second period $P_2$. Also in this case, the energy of the ions toward the support 14 becomes relatively higher within the first period and relatively lower within the second period.

Alternatively, in the method MT3, the second radio-frequency power HF may be supplied as a continuous radio-frequency power in the first period $P_1$ and supplied as a pulsed radio-frequency power in the positive voltage output period in the second period $P_2$. Also in this case, the energy of the ions toward the support 14 becomes relatively higher within the first period and relatively lower within the second period.

Figure 11:
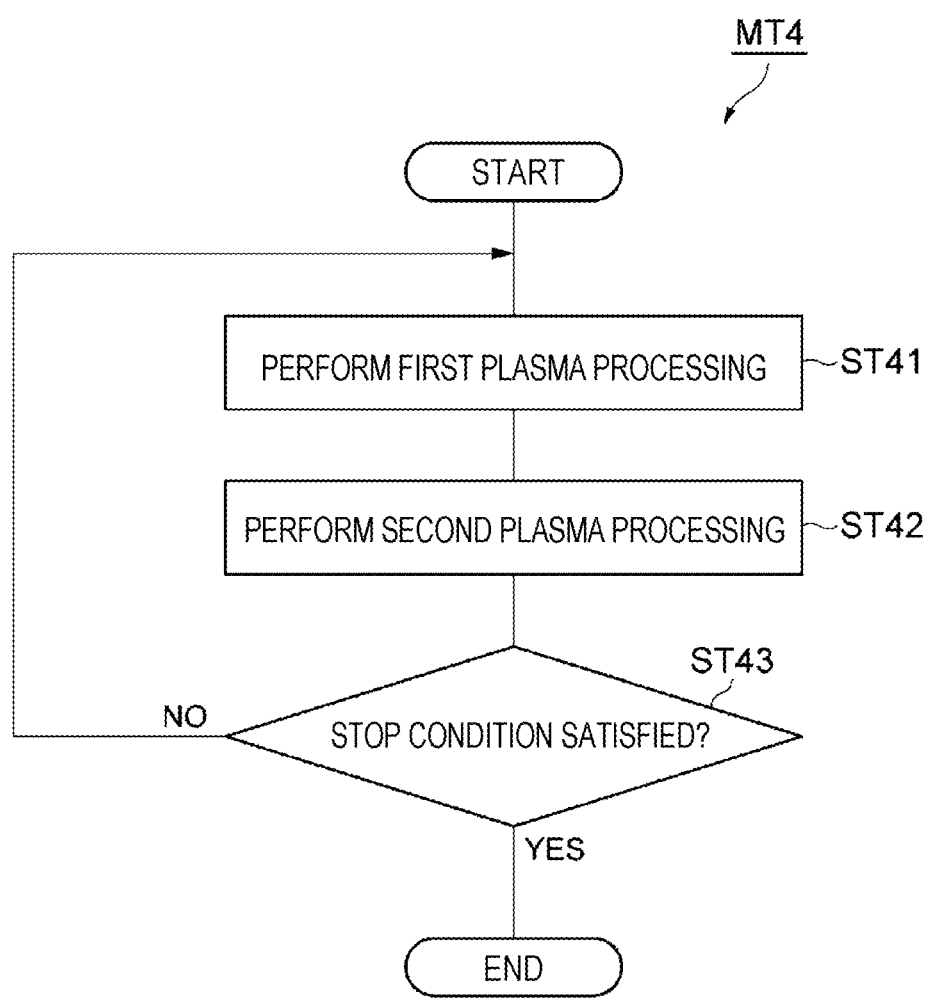
FIG. 11 is a flowchart of a plasma processing method according to still another embodiment.
Figure 12A:
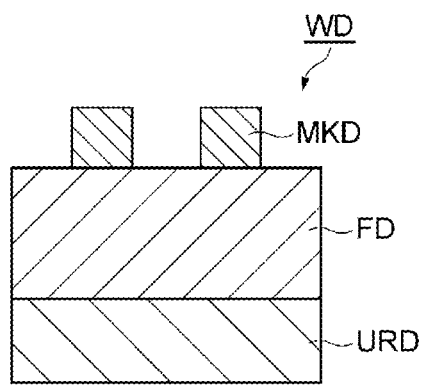
FIG. 12A is a partially enlarged cross-sectional view of an example substrate.
Figure 12B:
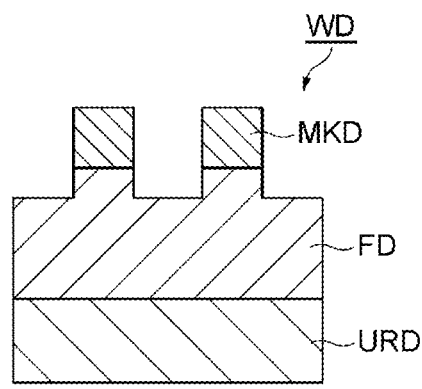
FIGS. 12B to 12D are partially enlarged cross-sectional views of the example substrate in a state after performing each of a plurality of steps of a method MT4.
Figure 12C:
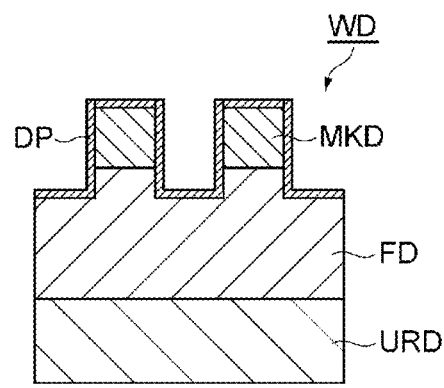
Figure 12D:
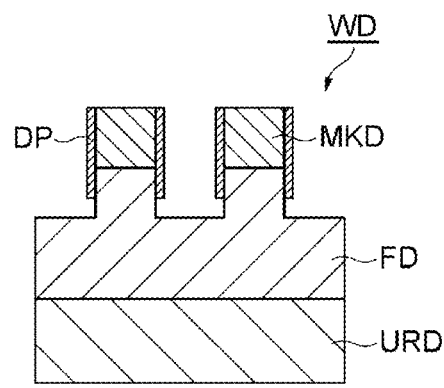

Subsequently, reference is made to FIGS. 11, 12A, 12B, 12C, and 12D. FIG. 11 is a flowchart of a plasma processing method according to still another embodiment. FIG. 12A is a partially enlarged cross-sectional view of an example substrate. FIGS. 12B to 12D are partially enlarged cross-sectional views of the example substrate in a state after performing each of the plurality of steps of the method MT4 illustrated in FIG. 11.

The method MT4 illustrated in FIG. 11 includes a step ST41 and a step ST42. The step ST41 is executed in the first period $P_1$ like the step ST11 of the method MT1. The first period $P_1$ may be a period having the same time length as the time length of the single cycle $P_{LF}$. In the step ST41, the first plasma processing is performed. The step ST42 is executed in the first period $P_2$ like the step ST12 of the method MT1. The second period $P_2$ is a period following the first period $P_1$. The second period $P_2$ may be a period having the same time length as the time length of the single cycle $P_{LF}$. In the step ST42, the second plasma processing is performed.

In the step ST41, the processing gas is supplied into the chamber 10. In the step ST42, the same processing gas as the processing gas used in the step ST41 or another processing gas is supplied into the chamber 10. In the steps ST41 and ST42, the gas supply GS is controlled by the controller 80. In the steps ST41 and ST42, the exhaust device 50 is controlled by the controller 80 to set the pressure in the chamber 10 to the designated pressure. The pressure in the chamber 10 is set to a pressure within the range of, for example, several mTorr to 1,000 mTorr.

In the steps ST41 and ST42, the first radio-frequency power LF is continuously supplied to the lower electrode 18. That is, in the method MT4, the first radio-frequency power LF is continuously supplied to the lower electrode 18 during the first period $P_1$ and the second period $P_2$. In the steps ST41 and ST42, the first radio-frequency power supply 61 is controlled by the controller 80 in order to supply the first radio-frequency power LF to the lower electrode 18.

The second radio-frequency power HF is supplied to the lower electrode 18 (or the upper electrode 30) as a pulsed radio-frequency power in a first partial period $SP_1$ in the first period $P_1$ and in a second partial period $SP_2$ in the second period $P_2$. That is, in the step ST41, the second radio-frequency power HF is supplied as a pulsed radio-frequency power in the first partial period $SP_1$. Further, in the step ST42, the second radio-frequency power HF is supplied as a pulsed radio-frequency power in the second partial period $SP_2$. In the steps ST41 and ST42, the second radio-frequency power supply 62 is controlled by the controller 80 in order to supply the second radio-frequency power HF.

In the method MT4, the first partial period $SP_1$ is included in the negative voltage output period within each cycle $P_{LF}$ of the first radio-frequency power LF. In the method MT4, the second partial period $SP_2$ is included in the positive voltage output period within each cycle $P_{LF}$ of the first radio-frequency power LF.

In the steps ST41 and ST42, a plasma is formed from the processing gas in the chamber 10. In the step ST41, the second radio-frequency power HF is supplied as a pulsed radio-frequency power within the negative voltage output period. Therefore, in the step ST41, the $V_{pp}$ of the substrate on the support 14 becomes higher, and the energy of ions from the plasma toward the support 14 becomes relatively higher.

Meanwhile, in the step ST42, the second radio-frequency power HF is supplied as a pulsed radio-frequency power within the positive voltage output period. Therefore, in the step ST42, the $V_{pp}$ of the substrate on the support 14 becomes lower, and the energy of ions from the plasma toward the support 14 becomes relatively lower.

In the method MT4, the substrate is disposed in the chamber 10 during the first period $P_1$ and the second period $P_2$. The substrate is placed on the support 14 in the chamber 10. A substrate WD to which the method MT4 is applicable includes a base region URD and a film FD, as illustrated in FIG. 12A. The film FD is provided on the base region URD. The substrate WD may further include a mask MKD. The mask MKD is provided on the film FD. The mask MKD is patterned to partially expose the film FD. In an example, the base region URD is formed of silicon oxide, the film FD is an organic film or a silicon oxide film, and the mask MKD has a multi-layer structure including a photoresist film and an anti-reflection film. The mask MKD is provided on the film FD. The anti-reflection film of the mask MKD contains silicon. The photoresist film of the mask MKD is provided on the anti-reflection film of the mask MKD.

The processing gas used in the step ST41 may include an oxygen-containing gas such as $O_2$ gas when the film FD is an organic film. The processing gas used in the step ST41 may further include a rare gas such as argon gas when the film FD is an organic film. The processing gas used in the step ST41 may include a fluorocarbon gas such as $C_4F_8$ gas when the film FD is a silicon oxide film. The processing gas used in the step ST41 may be a mixed gas containing a fluorocarbon gas such as $C_4F_8$ gas, an oxygen-containing gas such as $O_2$ gas, and a rare gas such as argon gas, regardless of whether the film FD is either an organic film or a silicon oxide film.

The processing gas used in the step ST42 may include a fluorocarbon gas such as $C_4F_8$ gas when the film FD is either an organic film or a silicon oxide film. The processing gas used in the steps ST42 may further include an oxygen-containing gas such as $O_2$ gas and/or a rare gas such as argon gas.

In the step ST41, the energy of the ions toward the support 14 is relatively high. Therefore, in the step ST41, the film FD is irradiated with ions from the plasma, and the film FD is etched by chemical ion etching. As illustrated in FIG. 12B, in the step ST41, the film FD is etched to provide a side wall surface. In the step ST42, the energy of the ions toward the support 14 is relatively low. In the step ST42, as illustrated in FIG. 12C, the chemical species from the plasma forms a film of the deposit DP on the surface of the substrate WD. The film of the deposit DP is formed from chemical species of carbon and/or fluorocarbon species.

In the subsequent step ST43, it is determined whether the stop condition is satisfied. In the step ST43, the stop condition is determined to be satisfied when the number of executions of the sequence including the steps ST41 and ST42 reaches a predetermined number. Alternatively, in the step ST43, the stop condition may be determined based on the emission intensity of the predetermined wavelength acquired by the emission analyzer 54, or may be determined based on the sequence including the steps ST41 and ST42 or the execution time length of the repetition of the sequence. When it is determined in the step ST43 that the stop condition is not satisfied, the sequence including the steps ST41 and ST42 is executed again. The etching in the step ST41 has anisotropy. Therefore, in the step ST41, as illustrated in FIG. 12D, the deposit DP extending on the side wall surface of the substrate WD is left. Meanwhile, in the step ST41, the deposit DP extending on the other surface (horizontal surface) of the substrate W is removed, and the film FD is further etched. When it is determined in the step ST43 that the stop condition is satisfied, the method MT4 is ended.

In the method MT4, the steps ST41 and ST42 are alternately repeated. That is, in the method MT4, formation of the deposit DP (step ST42) and etching of the film FD (step ST41) are alternately performed. According to the method MT4, the side wall surface of the film FD is protected by the deposit DP during the etching of the film FD.

Figure 13:
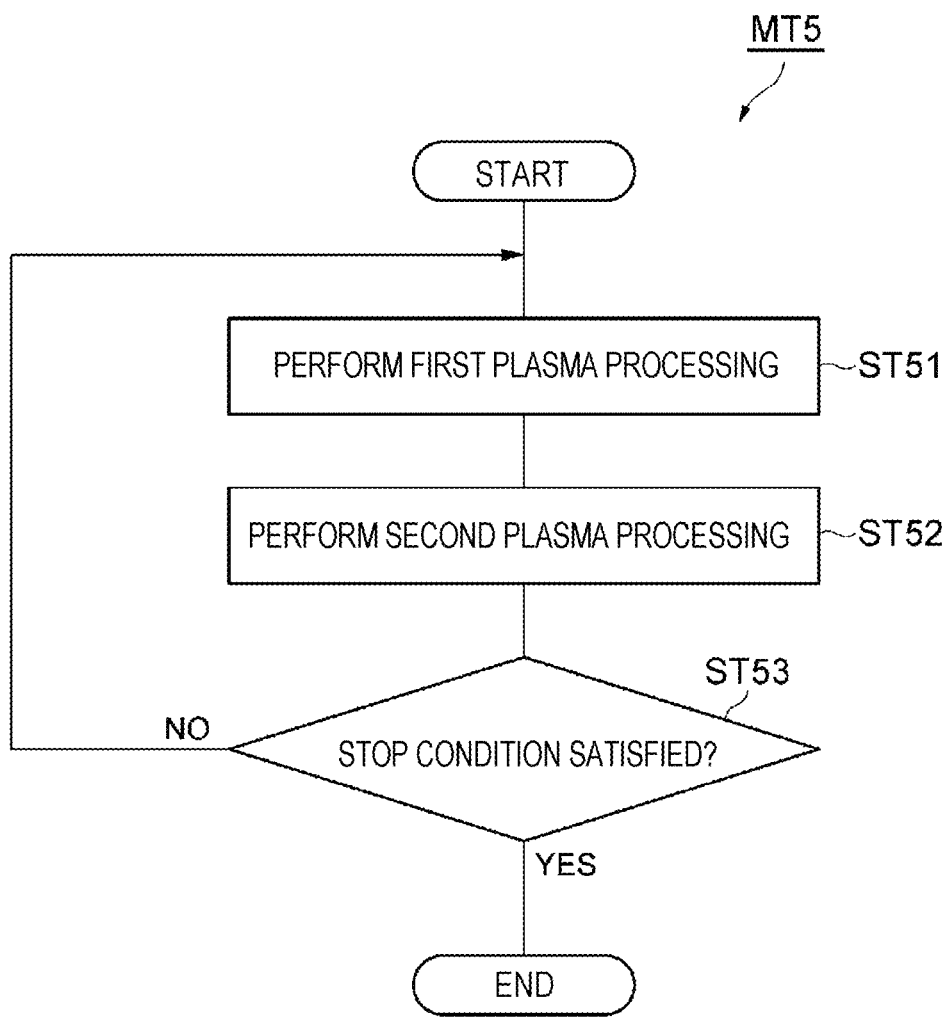
FIG. 13 is a flowchart of a plasma processing method according to still another embodiment.
Figure 14A:
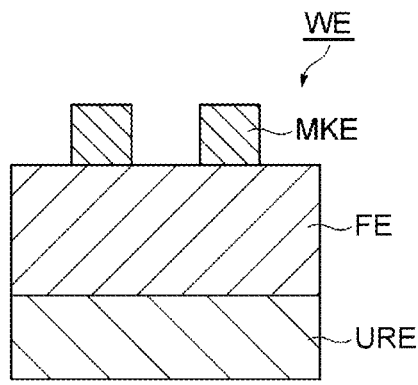
FIG. 14A is a partially enlarged cross-sectional view of an example substrate.
Figure 14B:
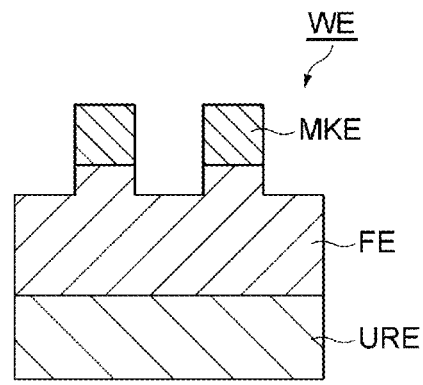
FIGS. 14B to 14D are partially enlarged cross-sectional views of the example substrate in a state after performing each of a plurality of steps of a method MT5.
Figure 14C:
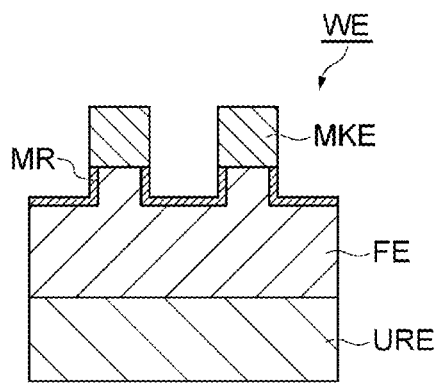
Figure 14D:
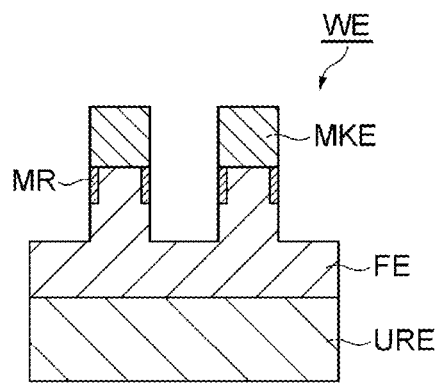

Subsequently, reference is made to FIGS. 13, 14A, 14B, 14C, and 14D. FIG. 13 is a flowchart of a plasma processing method according to still another embodiment. FIG. 14A is a partially enlarged cross-sectional view of an example substrate. FIGS. 14B to 14D are partially enlarged cross-sectional views of the example substrate in a state after performing each of the plurality of steps of the method MT5 illustrated in FIG. 13.

The method MT5 illustrated in FIG. 13 includes a step ST51 and a step ST52. The step ST51 is executed in the first period $P_1$ like the step ST11 of the method MT1. The first period $P_1$ may be a period having the same time length as the time length of the single cycle $P_{LF}$. In the step ST51, the first plasma processing is performed. The step ST52 is executed in the first period $P_2$ like the step ST12 of the method MT1. The second period $P_2$ is a period following the first period $P_1$. The second period $P_2$ may be a period having the same time length as the time length of the single cycle $P_{LF}$. In the step ST52, the second plasma processing is performed.

In the step ST51, the processing gas is supplied into the chamber 10. In the step ST52, the same processing gas as the processing gas used in the step ST51 or another processing gas is supplied into the chamber 10. In the steps ST51 and ST52, the gas supply GS is controlled by the controller 80. In the steps ST51 and ST52, the exhaust device 50 is controlled by the controller 80 to set the pressure in the chamber 10 to the designated pressure. The pressure in the chamber 10 is set to a pressure within the range of, for example, several mTorr to 1,000 mTorr.

In the steps ST51 and ST52, the first radio-frequency power LF is continuously supplied to the lower electrode 18. That is, in the method MT5, the first radio-frequency power LF is continuously supplied to the lower electrode 18 during the first period $P_1$ and the second period $P_2$. In the steps ST51 and ST52, the first radio-frequency power supply 61 is controlled by the controller 80 in order to supply the first radio-frequency power LF to the lower electrode 18.

The second radio-frequency power HF is supplied to the lower electrode 18 (or the upper electrode 30) as a pulsed radio-frequency power in a first partial period $SP_1$ in the first period $P_1$ and in a second partial period $SP_2$ in the second period $P_2$. That is, in the step ST51, the second radio-frequency power HF is supplied as a pulsed radio-frequency power in the first partial period $SP_1$. Further, in the step ST52, the second radio-frequency power HF is supplied as a pulsed radio-frequency power in the second partial period $SP_2$. In the steps ST51 and ST52, the second radio-frequency power supply 62 is controlled by the controller 80 in order to supply the second radio-frequency power HF.

In the method MT5, the first partial period $SP_1$ is included in the negative voltage output period within each cycle $P_{LF}$ of the first radio-frequency power LF. In the method MT5, the second partial period $SP_2$ is included in the positive voltage output period within each cycle $P_{LF}$ of the first radio-frequency power LF.

In the steps ST51 and ST52, a plasma is formed from the processing gas in the chamber 10. In the step ST51, the second radio-frequency power HF is supplied as a pulsed radio-frequency power within the negative voltage output period. Therefore, in the step ST51, the $V_{pp}$ of the substrate on the support 14 becomes higher, and the energy of ions from the plasma toward the support 14 becomes relatively higher.

Meanwhile, in the step ST52, the second radio-frequency power HF is supplied as a pulsed radio-frequency power within the positive voltage output period. Therefore, in the step ST52, the $V_{pp}$ (crest value of voltage) of the substrate on the support 14 becomes lower, and the energy of ions from the plasma toward the support 14 becomes relatively lower.

In the method MT5, the substrate is disposed in the chamber 10 during the first period $P_1$ and the second period $P_2$. The substrate is placed on the support 14 in the chamber 10. A substrate WE to which the method MT5 is applicable includes a base region URE and a film FE, as illustrated in FIG. 14A. The film FE is provided on the base region URE. The substrate WE may further include a mask MKE. The mask MKE is provided on the film FE. The mask MKE is patterned to partially expose the film FE. In an example, the base region URE is formed of silicon oxide, the film FE is formed of polycrystalline silicon, and the mask MKE is formed of silicon oxide.

The processing gas used in the step ST51 may include a halogen-containing gas such as $Cl_2$ gas, HBr gas, and $SF_6$ gas. The processing gas used in the step ST51 may further include an oxygen-containing gas such as $O_2$ gas. The processing gas used in the step ST52 may include an oxygen-containing gas such as $O_2$ gas when the processing gas is different from the processing gas used in the step ST51. The processing gas used in the step ST51 may further include a rare gas such as argon gas.

In the step ST51, the energy of the ions toward the support 14 is relatively high. Therefore, in the step ST51, the film FE is irradiated with ions from the plasma, and the film FE is etched by chemical ion etching. As illustrated in FIG. 14B, in the step ST51, the film FE is etched to provide a side wall surface. In the step ST52, the energy of the ions toward the support 14 is relatively low. In the step ST52, as illustrated in FIG. 14C, the etching of the film FE is suppressed, a region including the surface of the film FE is modified, and the modified region MR is formed. For example, the modified region MR is formed by oxidizing silicon in a region including the surface of the film FE.

In the subsequent step ST53, it is determined whether the stop condition is satisfied. In the step ST53, the stop condition is determined to be satisfied when the number of executions of the sequence including the steps ST51 and ST52 reaches a predetermined number. Alternatively, in the step ST53, the stop condition may be determined based on the emission intensity of the predetermined wavelength acquired by the emission analyzer 54, or may be determined based on the sequence including the steps ST51 and ST52 or the execution time length of the repetition of the sequence. When it is determined in the step ST53 that the stop condition is not satisfied, the sequence including the steps ST51 and ST52 is executed again. When it is determined in the step ST53 that the stop condition is satisfied, the method MT5 is ended.

In the method MT5, the steps ST51 and ST52 are alternately repeated. That is, in the method MT5, formation of the film FE (step ST52) and etching of the film FE (step ST51) are alternately performed. In the method MT5, since the side wall surface of the film FE is modified, as illustrated in FIG. 14D, the etching of the side wall surface in the step ST51 is suppressed.

Figure 15:
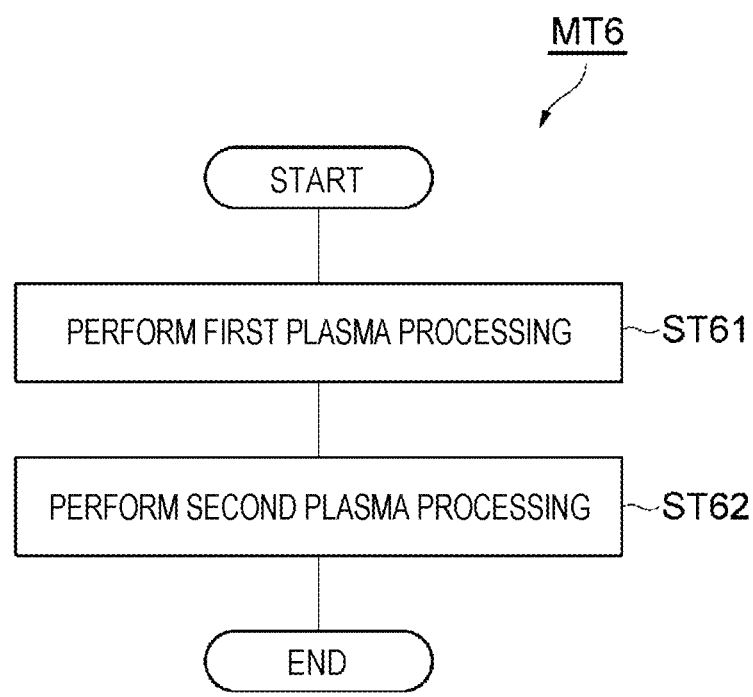
FIG. 15 is a flowchart of a plasma processing method according to still another embodiment.
Figure 16A:
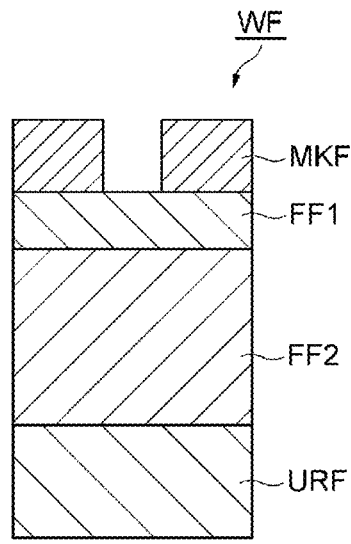
FIG. 16A is a partially enlarged cross-sectional view of an example substrate.
Figure 16B:
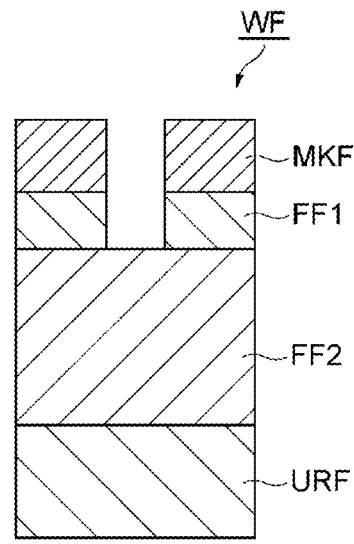
FIGS. 16B and 16C are partially enlarged cross-sectional views of the example substrate in a state after performing each of a plurality of steps of a method MT6.
Figure 16C:
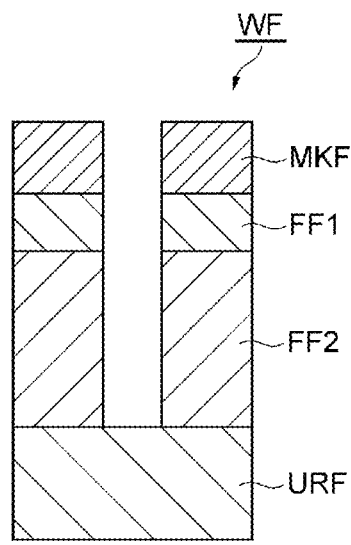
Figure 17:
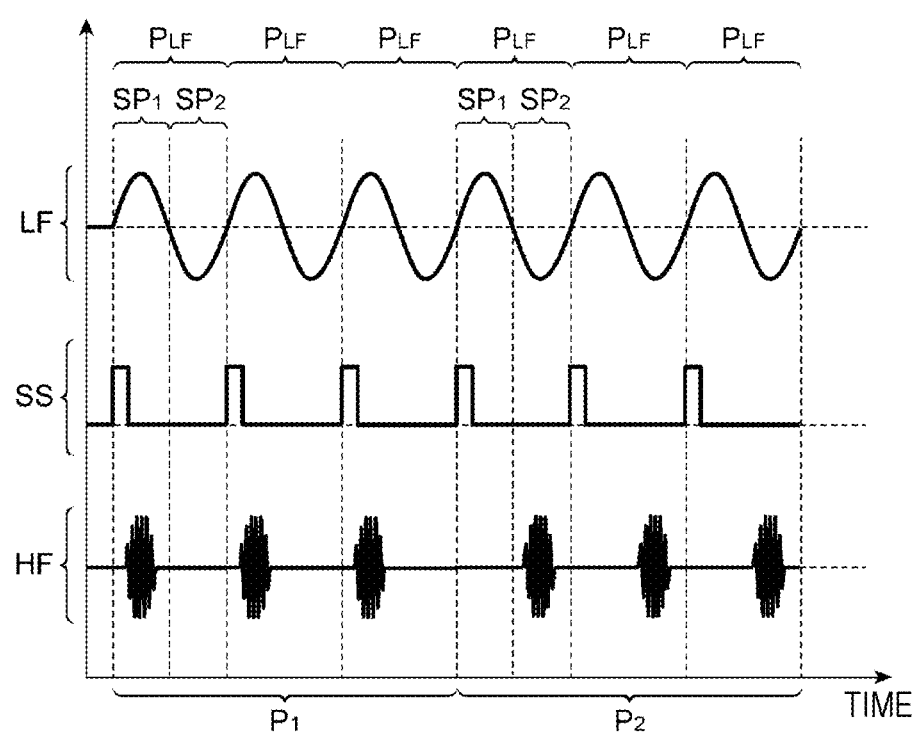
FIG. 17 is a timing chart of an example related to the method MT6.

Subsequently, reference is made to FIGS. 15, 16A, 16B, 16C, and 17. FIG. 15 is a flowchart of a plasma processing method according to still another embodiment. FIG. 16A is a partially enlarged cross-sectional view of an example substrate. FIGS. 16B and 16C are partially enlarged cross-sectional views of the example substrate in a state after performing each of the plurality of steps of the method MT6 illustrated in FIG. 15. FIG. 17 is a timing chart of an example related to the method MT6. In FIG. 17, the vertical axis represents the first radio-frequency power LF, the synchronization signal SS, and the second radio-frequency power HF.

The method MT6 illustrated in FIG. 15 includes a step ST61 and a step ST62. The step ST61 is executed in the first period $P_1$ like the step ST11 of the method MT1. In the step ST61, the first plasma processing is performed. The step ST62 is executed in the first period $P_2$ like the step ST12 of the method MT1. The second period $P_2$ is a period following the first period $P_1$. In the step ST62, the second plasma processing is performed.

In the steps ST61 and ST62, the processing gas is supplied into the chamber 10. In the steps ST61 and ST62, the gas supply GS is controlled by the controller 80 to supply the processing gas. In the steps ST61 and ST62, the exhaust device 50 is controlled by the controller 80 to set the pressure in the chamber 10 to the designated pressure. The pressure in the chamber 10 is set to a pressure within the range of, for example, several mTorr to 1,000 mTorr.

In the steps ST61 and ST62, the first radio-frequency power LF is continuously supplied to the lower electrode 18.

That is, in the method MT2, the first radio-frequency power LF is continuously supplied to the lower electrode 18 during the first period $P_1$ and the second period $P_2$. In the steps ST61 and ST62, the first radio-frequency power supply 61 is controlled by the controller 80 in order to supply the first radio-frequency power LF to the lower electrode 18.

In the method MT6, the second radio-frequency power HF is supplied is to the lower electrode 18 (or the upper electrode 30) as a pulsed radio-frequency power within the first partial period $SP_1$ in the first period $P_1$ and the second partial period $SP_2$ in the second period $P_2$. That is, in the step ST61, the second radio-frequency power HF is supplied as a pulsed radio-frequency power in the first partial period $SP_1$. Further, in the step ST62, the second radio-frequency power HF is supplied as a pulsed radio-frequency power in the second partial period $SP_2$. In the steps ST61 and ST62, the second radio-frequency power supply 62 is controlled by the controller 80 in order to supply the second radio-frequency power HF.

In the method MT6, the first partial period $SP_1$ is included in the positive voltage output period within each cycle $P_{LF}$ of the first radio-frequency power LF. In the method MT6, the second partial period $SP_2$ is included in the negative voltage output period within each cycle $P_{LF}$ of the first radio-frequency power LF.

In the steps ST61 and ST62, a plasma is formed from the processing gas in the chamber 10. In the step ST61, the second radio-frequency power HF is supplied as a pulsed radio-frequency power within the positive voltage output period, as illustrated in FIG. 17. Therefore, in the step ST61, the $V_{pp}$ of the substrate on the support 14 becomes lower, and the energy of ions from the plasma toward the support 14 becomes relatively lower.

Meanwhile, in the step ST62, the second radio-frequency power HF is supplied as a pulsed radio-frequency power within the negative voltage output period. Therefore, in the step ST62, the $V_{pp}$ of the substrate on the support 14 becomes higher, and the energy of ions from the plasma toward the support 14 becomes relatively higher.

As illustrated in FIG. 16A, a substrate WF to which the method MT6 is applicable has a first film FF1 and a second film FF2. The first film FF1 is provided on the second film FF2. The substrate WF may further include a base region URF and a mask MKF. The second film FF2 is provided on the base region URF. The mask MKF is provided on the first film FF1. The mask MKF is patterned to partially expose the first film FF1. In an example, the base region URF is formed of silicon. The first film FF1 is an anti-reflection film containing silicon. The second film FF2 is formed of silicon nitride. The mask MKF is formed of a photoresist film.

In the method MT6, the substrate WF is disposed in the chamber 10 during the first period $P_1$ and the second period $P_2$. The substrate WF is placed on the support 14 in the chamber 10. The processing gas used in the steps ST61 and ST62 may include a fluorocarbon gas such as $C_4F_8$ gas. The processing gas used in the steps ST61 and ST62 may further include a rare gas such as argon gas.

As illustrated in FIG. 16B, in the step ST61, ions from the plasma are applied to the first film FF1 to expose the second film FF2, and the first film FF1 is etched by chemical ion etching. When it is determined from the emission intensity obtained by the emission analyzer 54 that the etching amount of the first film FF1 has decreased, the step ST61 is ended. Alternatively, the step ST61 is ended after a lapse of a predetermined time.

As illustrated in FIG. 16C, in the step ST62, ions from the plasma are applied to the second film FF2 to expose the base region URF and the second film FF2 is etched by chemical ion etching. When it is determined from the emission intensity obtained by the emission analyzer 54 that the etching amount of the second film FB2 has decreased, the step ST62 is ended. For example, when the emission intensity of CO acquired by the emission analyzer 54 is determined to be equal to or lower than a predetermined value, the step ST62 is ended. Alternatively, the step ST62 is ended after a lapse of a predetermined time.

According to the method MT6, it is possible to etch a multi-layer film having a film capable of being etched with relatively low energy as the first film FF1 and having a film requiring relatively high energy for the etching as the second film FB2.

In the method MT6, the second radio-frequency power HF may be supplied as one of a pulsed radio-frequency power and a continuous radio-frequency power in each period $P_{LF}$ in the first period $P_1$, and supplied as the other radio-frequency power in each period $P_{LF}$ in the second period $P_2$. Specifically, in the method MT6, the second radio-frequency power HF may be supplied as a pulsed radio-frequency power in the positive voltage output period in the first period $P_1$ and supplied as a continuous radio-frequency power in the second period $P_2$. Also in this case, the energy of the ions toward the support 14 becomes relatively lower within the first period $P_1$ and relatively higher within the second period $P_2$.

Alternatively, in the method MT6, the second radio-frequency power HF may be supplied as a continuous radio-frequency power in the first period $P_1$ and supplied as a pulsed radio-frequency power in the negative voltage output period in the second period $P_2$. Also in this case, the energy of the ions toward the support 14 becomes relatively lower within the first period $P_1$ and relatively higher within the second period $P_2$.

Figure 18:
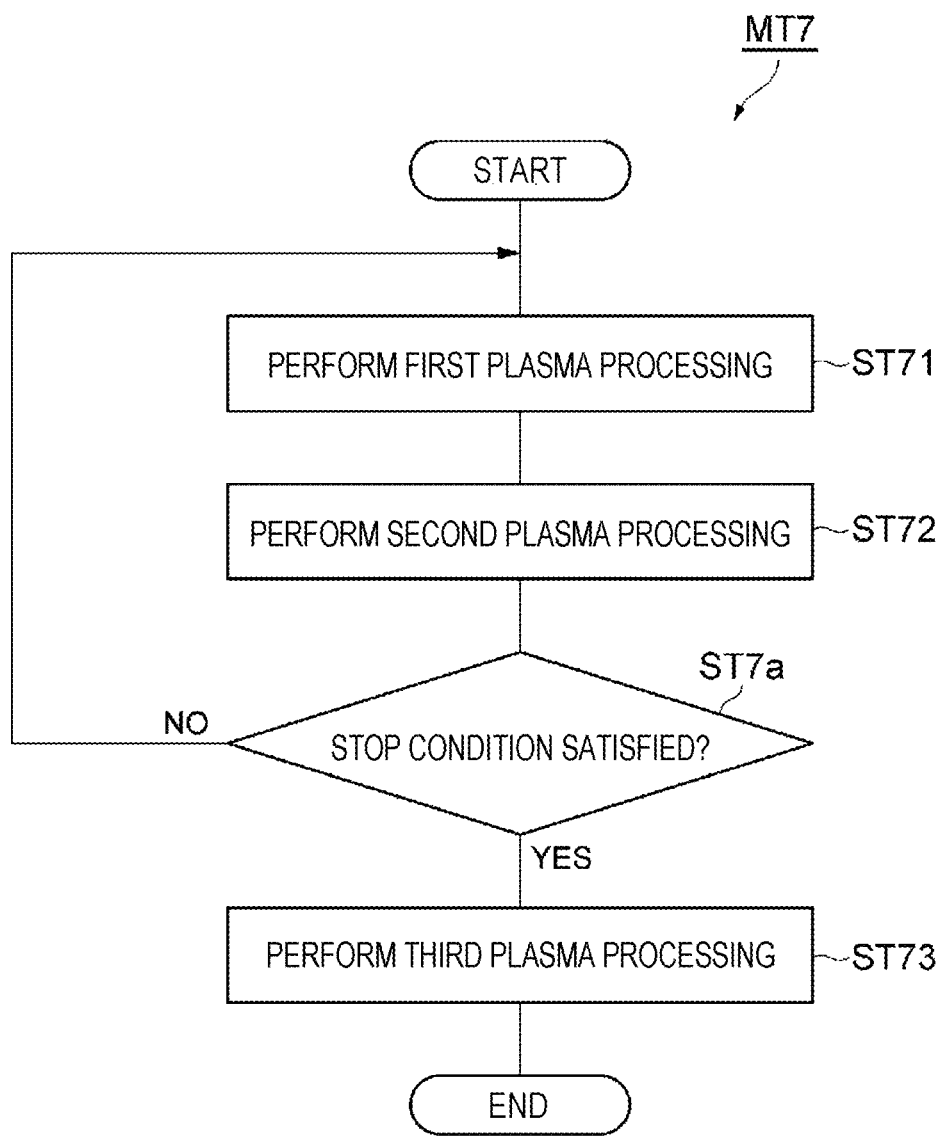
FIG. 18 is a flowchart of a plasma processing method according to still another embodiment.
Figure 19:
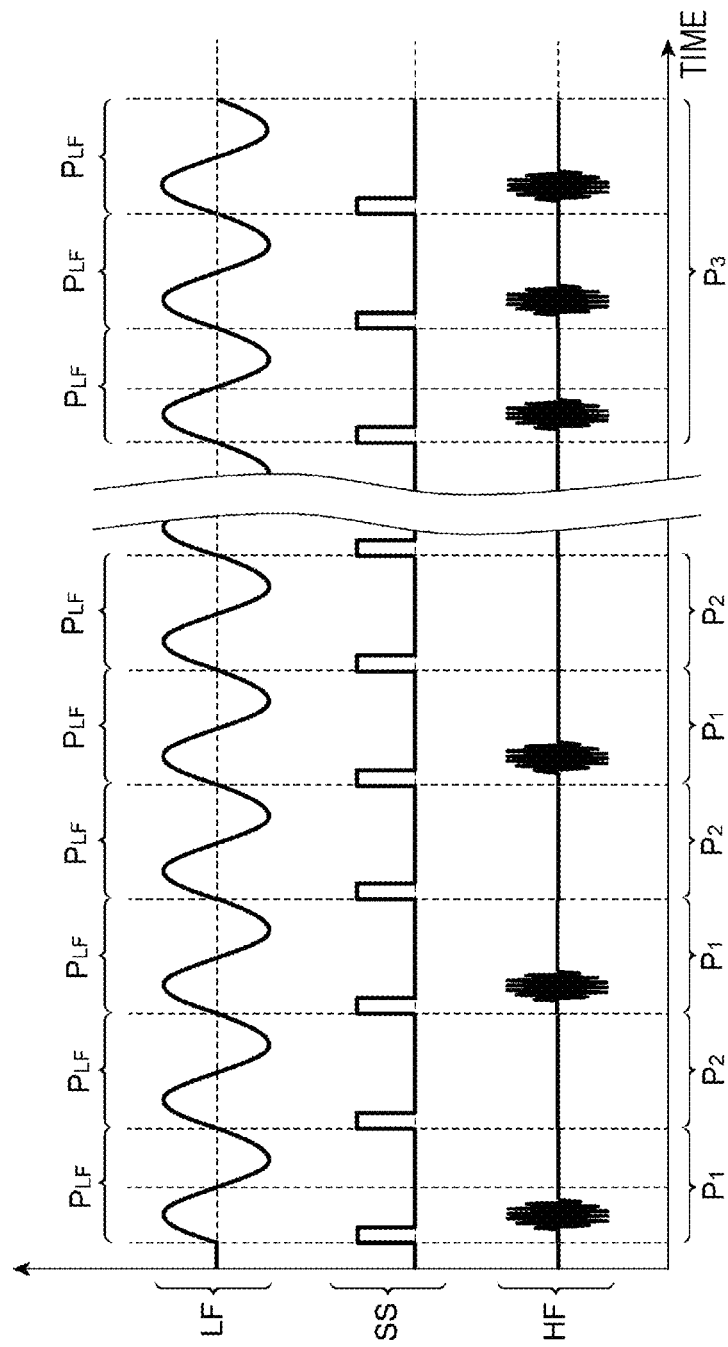
FIG. 19 is a timing chart of an example related to a method MT7 illustrated in FIG. 18.

Subsequently, reference is made to FIGS. 18, 19, 20A, 20B, 20C, 20D, and 20E. FIG. 18 is a flowchart of a plasma processing method according to still another embodiment. FIG. 19 is a timing chart of an example related to a method MT7 illustrated in FIG. 18. FIG. 20A is a partially enlarged cross-sectional view of an example substrate. FIGS. 20B to 20E are partially enlarged cross-sectional views of the example substrate in a state after performing each of the plurality of steps of the method MT7.

The method MT7 illustrated in FIG. 18 includes a step ST71 and a step ST72. The step ST71 is executed in the first period $P_1$ like the step ST11 of the method MT1. The first period $P_1$ may be a period having the same time length as the time length of the single cycle $P_{LF}$. The start point of the first period $P_1$ coincides with the start point of the corresponding period $P_{LF}$. In the step ST71, the first plasma processing is performed. The step ST72 is executed in the first period $P_2$ like the step ST12 of the method MT1. The second period $P_2$ is a period following the first period $P_1$. The first period $P_2$ is a period having the same time length as the time length of the single cycle $P_{LF}$. The start point of the first period $P_2$ coincides with the start point of the corresponding period $P_{LF}$. In the step ST72, the second plasma processing is performed. In the method MT7, the steps ST71 and ST72 are alternately repeated.

The method MT7 may further include a step ST73. In the step ST73, the third plasma processing is performed. The step ST73 is executed in the third period $P_3$. The third period $P_3$ is a period following the period in which the steps ST71 and ST72 are alternately repeated.

In the steps ST71, ST72, and ST73, the processing gas is supplied into the chamber 10. In the steps ST71, ST72, and ST73, the gas supply GS is controlled by the controller 80 to supply the processing gas into the chamber 10. In the steps ST71, ST72, and ST73, the exhaust device 50 is controlled by the controller 80 to set the pressure inside the chamber 10 to the designated pressure. The pressure in the chamber 10 is set to a pressure within the range of, for example, several mTorr to 1,000 mTorr.

In the steps ST71, ST72, and ST73, the first radio-frequency power LF is continuously supplied to the lower electrode 18. That is, in the method MT7, the first radio-frequency power LF is continuously supplied to the lower electrode 18 during the first period $P_1$ and the second period $P_2$. Further, in the method MT7, the first radio-frequency power LF is continuously supplied even in the third period $P_3$. In the steps ST71, ST72, and ST73, the first radio-frequency power supply 61 is controlled by the controller 80 in order to supply the first radio-frequency power LF to the lower electrode 18.

In the step ST71, the second radio-frequency power HF is supplied to the lower electrode 18 (or the upper electrode 30) as a pulsed radio-frequency power. That is, in the method MT7, the second radio-frequency power HF is supplied to the lower electrode 18 (or the upper electrode 30) as a pulsed radio-frequency power within the first period $P_1$. Specifically, in the method MT7, as illustrated in FIG. 19, the second radio-frequency power HF is supplied to the lower electrode 18 (or the upper electrode 30) as a pulsed radio-frequency power within the positive voltage output period within the first period $P_1$. In the step ST72, the second radio-frequency power HF is not supplied. That is, the second radio-frequency power HF is not supplied within the second period $P_2$. In the step ST73, the second radio-frequency power HF is supplied to the lower electrode 18 (or the upper electrode 30) as a pulsed radio-frequency power within the positive voltage output period within each cycle $P_{LF}$. In the steps ST71, ST72, and ST73, the second radio-frequency power supply 62 is controlled by the controller 80 in order to supply and stop the supply of the second radio-frequency power HF.

In the step ST71, a plasma is formed from the processing gas in the chamber 10. The $V_{pp}$ of the substrate on the support 14 in the step ST72 becomes higher than the $V_{pp}$ of the substrate on the support 14 in the step ST71. Therefore, the ions from the plasma generated in the first period $P_1$ collide with the substrate on the support 14 at high energy in the second period $P_2$.

In the step ST73, the second radio-frequency power HF is supplied as a pulsed radio-frequency power within the positive voltage output period. Therefore, in the step ST73, the $V_{pp}$ of the substrate on the support 14 becomes lower, and the energy of ions from the plasma toward the support 14 becomes relatively lower.

In the method MT7, the substrate is disposed in the chamber 10 for a period consisting of a repetition of the first period $P^1$ and the second period $P_2$ and a third period $P_3$. The substrate is placed on the support 14 in the chamber 10. A substrate WG to which the method MT7 is applicable has a base region URG and a film FG, as illustrated in FIG. 20A. The film FG is provided on the base region URG. The substrate WG may further include a mask MKG. The mask MKG is provided on the film FG. The mask MKG is patterned to partially expose the film FG. In an example, the base region URG is formed of silicon, the film FG is formed of silicon oxide, and the mask MKG has a multi-layer structure including a photoresist film and an anti-reflection film. The anti-reflection film of the mask MKG is provided on the film FG. The anti-reflection film of the mask MKG contains silicon. The photoresist film of the mask MKG is provided on the anti-reflection film of the mask MKG.

The processing gas used in the method MT7 may include a fluorocarbon gas such as $C_4F_8$ gas. The processing gas used in the method MT7 may further include an oxygen-containing gas such as $O_2$ gas and/or a rare gas such as argon gas.

The $V_{pp}$ of the substrate WD in the step ST71 is lower than the $V_{pp}$ of the substrate WD in the step ST72. In the step ST71, since the film FG is etched at a relatively low etching rate, the etching amount of the film FG is small as illustrated in FIG. 20B. In the step ST71, since the film FG is etched at a relatively low etching rate, the etching amount of the film FG is small as illustrated in FIG. 20C.

In a step ST7a following the step ST72, it is determined whether the stop condition is satisfied. In the step ST7a, the stop condition is determined to be satisfied when the number of executions of the sequence including the steps ST71 and ST72 reaches a predetermined number. When it is determined in the step ST7a that the stop condition is not satisfied, the sequence including the steps ST71 and ST72 is executed again. When it is determined in the step ST7a that the stop condition is not satisfied, the sequence including the steps ST71 and ST72 is executed again. Alternatively, in the step ST7a, the stop condition may be determined based on the emission intensity of the predetermined wavelength acquired by the emission analyzer 54, or may be determined based on the execution time length of the repetition of the sequence including the steps ST71 and ST72. When the film FG is etched by alternately repeating the steps ST71 and ST72, the base region URG is exposed as illustrated in FIG. 20D.

In the step ST73 that is performed next, over-etching of the film FG is performed as illustrated in FIG. 20E. In the step ST73, since ions of low energy are supplied to the substrate WG, over-etching of the film FG may be performed while suppressing damage to the base region URG.

Figure 21:
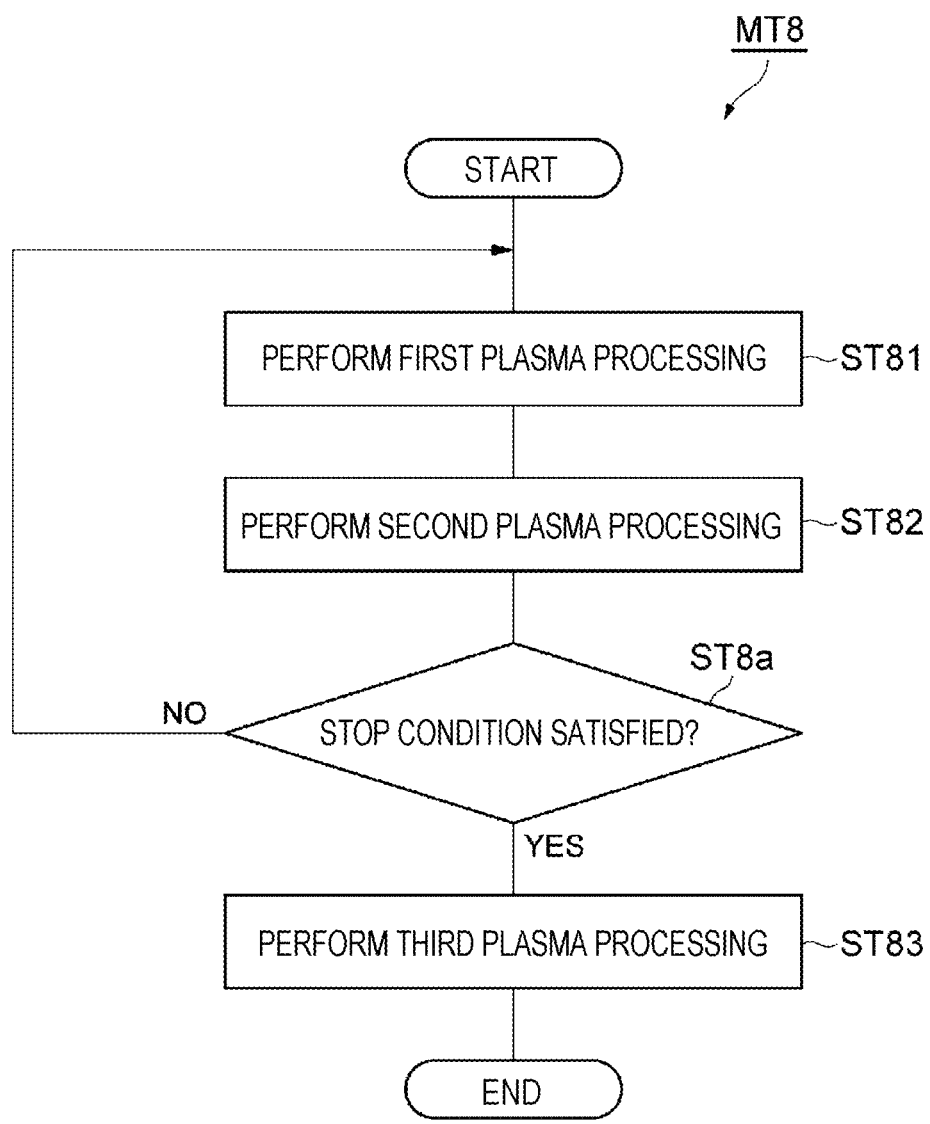
FIG. 21 is a flowchart of a plasma processing method according to still another embodiment.
Figure 22:
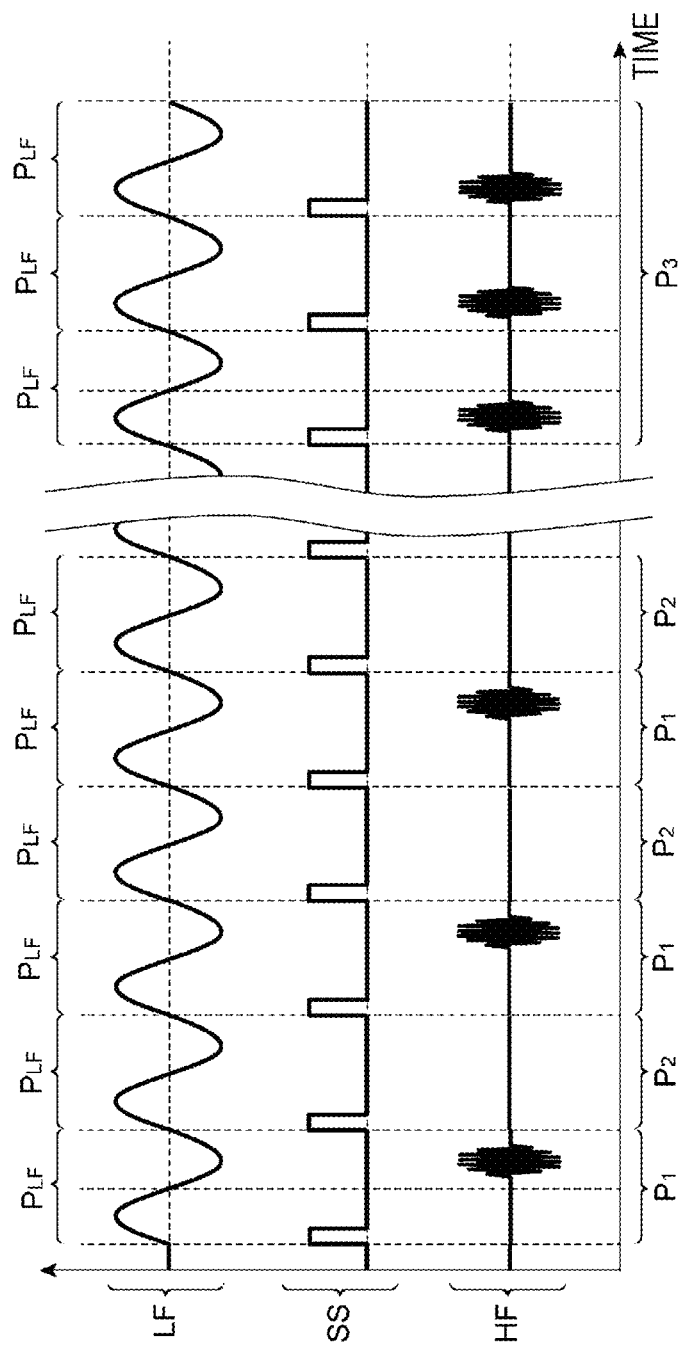
FIG. 22 is a timing chart of an example related to a method MT8 illustrated in FIG. 21.

Subsequently, reference is made to FIGS. 21 and 22. FIG. 21 is a flowchart of a plasma processing method according to still another embodiment. FIG. 22 is a timing chart of an example related to a method MT8 illustrated in FIG. 21.

The method MT8 illustrated in FIG. 21 includes a step ST81 and a step ST82. That is, the steps ST81 and ST82 are performed alternately. The step ST82 is the same step as the step ST72. The method MT8 may further include a step ST8a and a step ST83. The step ST8a is the same step as the step ST7a. In the step ST8a, it is determined whether the stop condition is satisfied. In the step ST8a, the stop condition is determined to be satisfied when the number of executions of the sequence including the steps ST81 and ST82 reaches a predetermined number. Alternatively, in the step ST8a, the stop condition may be determined based on the emission intensity of the predetermined wavelength acquired by the emission analyzer 54, or may be determined based on the execution time length of the repetition of the sequence including the steps ST81 and ST82. When it is determined in the step ST8a that the stop condition is not satisfied, the sequence including the steps ST81 and ST82 is executed again. Meanwhile, when it is determined in the step ST8a that the stop condition is satisfied, the step ST83 is executed. The step ST83 is the same step as the step ST73.

Hereinafter, differences between the steps ST81 and ST71 will be described. Specifically, in the step ST81, the second radio-frequency power HF is supplied to the lower electrode 18 (or the upper electrode 30) as a pulsed radio-frequency power within the negative voltage output period within the first period $P_1$. The process of the step ST81 is otherwise the same as the process of the step ST71.

The energy of the ions that collide with the substrate in the step ST81 becomes higher than the energy of the ions that collide with the substrate on the support 14 in the step ST71. Therefore, the etching rate of the film in the step ST81 of the method MT8 becomes higher than the etching rate of the same film in the step ST71. Further, the $V_{pp}$ of the substrate on the support 14 in the step ST82 becomes higher than the $V_{pp}$ of the substrate on the support 14 in the step ST81. Therefore, in the method MT8, the ions from the plasma generated in the first period $P_1$ collide with the substrate on the support 14 with high energy in the second period $P_2$. The method MT8 may be performed using the same processing gas as that used in the method MT7 to etch and over-etch the film FG of the substrate WG.

In the plasma processing methods according to the various embodiments described above, the energy of ions toward the support 14 is adjusted according to the mode of the second radio-frequency power HF. Specifically, the energy of ions toward the support 14 varies depending on whether the second radio-frequency power HF is supplied. The energy of ions toward the support 14 differs depending on whether the second radio-frequency power HF is supplied as a pulsed radio-frequency power or continuous radio-frequency power. The energy of ions toward the support 14 changes according to the period during which the second radio-frequency power HF is supplied with the pulsed radio-frequency power in each cycle $P_{LF}$ of the first radio-frequency power. For example, the energy of ions toward the support 14 is low when the second radio-frequency power HF is supplied as a pulsed radio-frequency power within the positive voltage output period. In addition, the energy of ions toward the support 14 is high when the second radio-frequency power HF is supplied as a pulsed radio-frequency power within the negative voltage output period. In the plasma processing method according to the various embodiments, the minimum time length during which the above mode is maintained may be set to the time length of one cycle of the first radio-frequency power LF. Therefore, it is possible to change the energy of the ions toward the support 14 at high speed.

Although various embodiments have been described above, the present disclosure is not limited to the embodiments described above, and various omissions, substitutions, and changes may be made. In addition, it is possible to combine the elements in different embodiments to form other embodiments.

The plasma processing method according to the various embodiments may be performed using an inductively coupled plasma processing apparatus. In the inductively coupled plasma processing apparatus, the second radio-frequency power is supplied to the antenna to form the inductive magnetic field in the chamber 10.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

DESCRIPTION OF SYMBOLS

10: chamber
14: support
18: lower electrode
LF: first radio-frequency power
HF: second radio-frequency power
$P_1$: first period
$P_2$: second period
$P_{LF}$: cycle

What is claimed is:

1. An RF system used in a plasma processing apparatus, the RF system comprising:
   a first RF power supply configured to generate a bias RF power having a first frequency, wherein a waveform defined by the first frequency has a plurality of cycles each divided into a first half cycle and a second half cycle;
   a second RF power supply configured to generate a source RF power having a second frequency higher than the first frequency; and
   a controller configured to
   (a) in a first period, control the second RF power supply such that the source RF power is generated during at least a portion of the first half cycle, and is not generated during the second half cycle, and
   (b) in a second period, control the second RF power supply such that the source RF power is generated during at least a portion of the second half cycle, and is not generated during the first half cycle.

2. The RF system according to claim 1, wherein the first half cycle includes a maximum potential value, the second half cycle includes a minimum potential value, and the control of the second RF power supply is performed in an order from (b) to (a).

3. The RF system according to claim 1, wherein (a) and (b) are repeated.

4. An RF system comprising:
   a first RF generator configured to generate a first RF signal having a first frequency, wherein each cycle defined by the first frequency has a first half cycle and a second half cycle; and
   a second RF generator configured to generate a second RF signal having a second frequency higher than the first frequency,
   wherein the second RF signal has
   (a) in a first period, a first power level during at least a portion of the first half cycle and a zero power level during the second half cycle, and
   (b) in the second period, a zero power level during the first half cycle and a second power level during at least a portion of the second half cycle.

5. The RF system according to claim 4, wherein the first power level is same as the second power level.

6. An RF system used in a plasma processing apparatus, the RF system comprising:
   a first RF power supply configured to generate a bias RF power having a first frequency, wherein a waveform defined by the first frequency has a plurality of cycles each divided into a first half cycle and a second half cycle at a zero intersection;
   a second RF power supply configured to generate a source RF power having a second frequency higher than the first frequency; and
   a controller configured to
   (a) in a first period, control the second RF power supply such that the source RF power is generated during the first half cycle, and (b) in a second period, control the second RF power supply such that the source RF power is generated during the second half cycle, and is not generated during the first half cycle.

7. An RF system used in a plasma processing apparatus, the RF system comprising:
- a first RF power supply configured to generate a bias RF power having a first frequency, wherein a waveform defined by the first frequency has a plurality of cycles each divided into a first half cycle and a second half cycle at a zero intersection;
- a second RF power supply configured to generate a source RF power having a second frequency higher than the first frequency; and
- a controller configured to
    - (a) in a first period, control the second RF power supply such that the source RF power is generated during at least a portion of the first half cycle, and is not generated during the second half cycle, and
    - (b) in a second period, control the second RF power supply such that the source RF power is not generated during the first half cycle.

8. The RF system according to claim 7, wherein the first half cycle includes a maximum potential value, and the second half cycle includes a minimum potential value.

9. The RF system according to claim 7, wherein (a) and (b) are repeated.

* * * * *